United States Patent [19]

Ikeda et al.

[11] Patent Number: 5,543,652

[45] Date of Patent: Aug. 6, 1996

[54] SEMICONDUCTOR DEVICE HAVING A TWO-CHANNEL MISFET ARRANGEMENT DEFINED BY I-V CHARACTERISTIC HAVING A NEGATIVE RESISTANCE CURVE AND SRAM CELLS EMPLOYING THE SAME

[75] Inventors: Shuji Ikeda; Makoto Saeki, both of Koganei, Japan

[73] Assignee: Hitachi, Ltd., Tokyo, Japan

[21] Appl. No.: 98,893

[22] Filed: Jul. 29, 1993

[30]  Foreign Application Priority Data

Aug. 10, 1992  [JP]  Japan .................................. 4-212855

[51] Int. Cl.[6] .......................... H01L 27/01; H01L 29/76; H01L 27/11
[52] U.S. Cl. .......................... 257/377; 257/351; 257/368; 257/369; 257/379; 257/380; 257/903; 257/904
[58] Field of Search .................................... 257/351, 369, 257/903, 904, 368, 377, 379, 380, 903, 904

[56]  References Cited

U.S. PATENT DOCUMENTS

| 4,481,524 | 11/1984 | Tsujide ...................................... 259/369 |
| 4,682,200 | 7/1987 | Uchida et al. ............................ 257/382 |
| 4,890,148 | 12/1989 | Ikeda et al. ............................... 357/45 |
| 5,005,068 | 4/1991 | Ikeda et al. .............................. 257/904 |
| 5,122,857 | 6/1992 | Ikeda et al. .............................. 257/377 |
| 5,132,771 | 7/1992 | Yamanaka et al. ...................... 257/390 |
| 5,296,729 | 3/1994 | Yamanaka et al. ...................... 257/377 |

FOREIGN PATENT DOCUMENTS 61-240498  10/1986  Japan .

*Primary Examiner*—Sara W. Crane
*Assistant Examiner*—Valencia Martin Wallace
*Attorney, Agent, or Firm*—Antonelli, Terry, Stout & Kraus

[57]  ABSTRACT

Negative characteristic MISFETs, which are of the same channel conductivity type and which have different threshold voltages, are formed in a doped silicon thin film deposited over a substrate and are connected in channel-to-channel series with each other. The pair of series-connected negative characteristic MISFETs, a resistive element, an information storage capacitive element and a transfer MISFET constitute an SRAM memory cell. Equivalently, a negative characteristic MISFET having a current-voltage characteristic defined by a negative resistance curve can be used in lieu of the pair of series-connected negative characteristic MISFETs in the formation of the individual memory cells of the SRAM. The negative resistance curve of the negative characteristic MISFET is shaped such that the linear current-voltage characteristic curve corresponding to the resistive element of the memory cell intersects the negative resistance curve at at least three location points. The negative characteristic MISFET, like the pair of series-connected negative characteristic MISFETs, has an active region formed in a doped thin film silicon (polycrystalline silicon) layer insulatedly above a substrate main surface. The resistive element is also formed in a thin film silicon layer either integrally with the negative characteristic MISFET or in a separate thin film silicon layer and in series electrical connection with the negative characteristic MISFET.

13 Claims, 17 Drawing Sheets

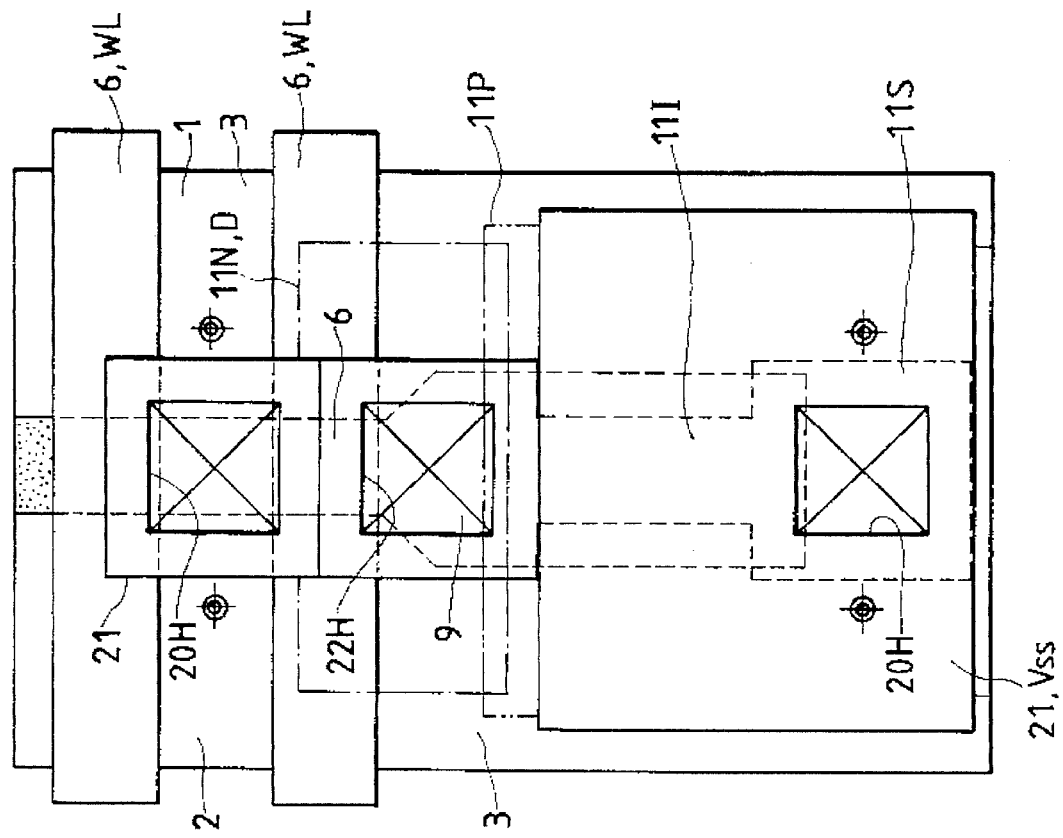
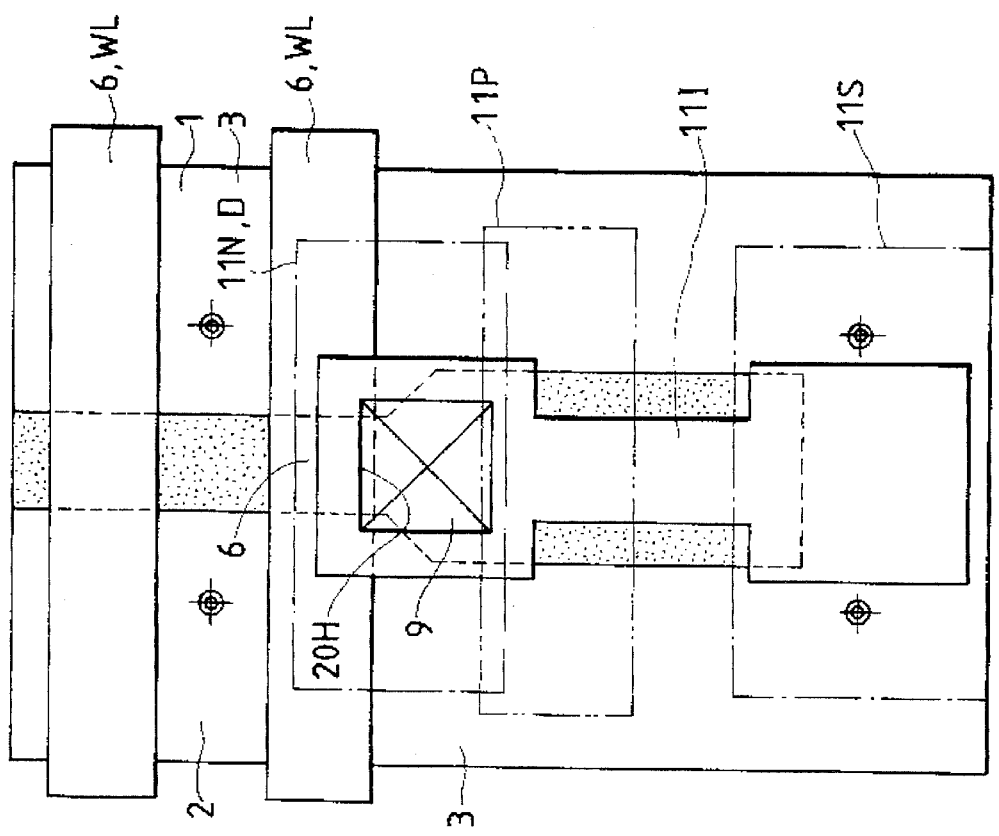

SEMICONDUCTOR DEVICE HAVING A TWO-CHANNEL MISFET ARRANGEMENT DEFINED BY I-V CHARACTERISTIC HAVING A NEGATIVE RESISTANCE CURVE AND SRAM CELLS EMPLOYING THE SAME

BACKGROUND OF THE INVENTION

The present invention relates to a technique, effectively applied to a semiconductor integrated circuit device having insulated-gate type field-effect transistors. More particularly this invention relates to a technique effectively applied to a semiconductor integrated circuit device having insulated-gate type field-effect transistors with a thin film structure. This invention also relates to a technique effectively applied to a semiconductor integrated circuit device having static random access memories.

Descriptions concerning the static random access memory are found, for example, in U.S. Pat. No. 4,890,148.

The static random access memory (SRAM: Static Random Access Memory) has one memory cell for one bit formed at an intersection between a complementary data line and a word line. This memory cell comprises a flip-flop circuit as an information storage section and two MOSFETs (Metal Oxide Semiconductor Field-Effect Transistors) for data transfer. The flip-flop circuit of the memory cell comprises two drive MOSFETs and two load elements. The load element generally uses either a load MOSFET or a high-resistance load element.

The SRAM of this kind requires at least six elements for each memory cell and thus the occupied area of the memory cell increases, degrading the circuit density. A commonly employed technique for reducing the occupied area of the memory cell is to arrange the load elements in a layer over the drive MOSFETs of the memory cell so that they overlap the drive MOSFETs. This technique forms elements: in a polycrystalline silicon film deposited over the principal plane of the monocrystal silicon substrate and is generally called an SOI (Silicon On Insulator) technique. This technique is also called a TFT (Thin Film Transistor) technique when the load MOSFETs are formed as the load elements.

However, even with the SOI technique or the TFT technique, one memory cell requires a total of four elements—two transfer MOSFETs and two drive MOSFETs—to be formed on a principal plane of the monocrystalline silicon substrate. That is, the memory cell fails to reduce its occupied area and therefore these techniques cannot be expected to make significant contributions to higher circuit density of SRAM.

BRIEF SUMMARY OF THE INVENTION

Japanese Patent Laid-Open No. 240498/1986 discloses a technique to reduce the occupied area of SRAM memory cells. In this technique, an SRAM memory cell is made up of a total of three elements—a switching transistor, a resistive element, and a negative resistive element. The switching transistor is formed on a principal plane of the silicon substrate and has one of semiconductor regions thereof connected to a data line and a gate electrode thereof connected to a word line. The resistive element is connected at one end to a power supply and at the other end connected to the second semiconductor region of the switching transistor. The resistive element is formed in a polycrystalline silicon film connected to the second semiconductor region of the switching transistor or in a part thereof. This resistive element has a linearity in a current-voltage characteristic. The negative resistive element has its cathode region connected to the second semiconductor region of the switching transistor and the second end of the resistive element. An anode region of the negative resistive element is formed of a tunnel diode connected to a reference power supply. The tunnel diode has its cathode region formed of the second semiconductor region of the switching transistor and the anode region formed of a highly doped epitaxial layer joined to the second semiconductor region. The negative resistive element has a negative characteristic in which the current-voltage characteristic curve becomes negative in an intermediate region.

In other words, the memory cell has three stable points formed at intersections between the negative curve of the current-voltage characteristic of the negative resistive element and the straight line of the current-voltage characteristic of the resistive element, these three stable points acting as a low level, an intermediate Level and a high level in retaining SRAM information. Consequently, the memory cell is formed with three elements, significantly reducing the occupied area of the memory cell and thereby increasing integration level of SRAM. Further, since the switching action of the negative resistive element of the memory cell is faster than the circuit operation of general flip-flop circuits, the operation speed of the SRAM can be enhanced.

However, the inventor of the present invention found that the aforementioned SRAM did not take into consideration the following respects.

(1) The memory cell of the above SRAM is formed of a negative resistive element, i.e. the anode region of the tunnel diode is formed of a highly doped epitaxial layer. The highly doped epitaxial layer is formed by an MBE (Molecular Beam Epitaxy) method and is selectively located at specified regions on the principal plane of the second semiconductor region of the switching transistor. Since the highly doped epitaxial layer formed by the MBE method is slow in the growth rate and takes time, it is not appropriate to incorporate a process of growing an epitaxial layer by the MBE method in the manufacture of SRAM, which is required to have a good mass-productivity.

(2) Instead of using the highly doped epitaxial layer formed by the MBE method, the negative resistive element may be formed by using different materials such as GaAs (gallium arsenide). However, different materials are not known in terms of matching with a SRAM as silicon device and hence it is difficult to incorporate different materials in the SRAM from the standpoint of yield.

So far, a novel device structure which has dealt with the above-mentioned problems has not been reported.

The objects of the present invention follow.

(1) To provide a novel element with negative-characteristic (e.g.) current-voltage characteristic having a negative resistance curve, which has good mass productivity and matching with silicon devices.

(2) To optimize the negative characteristic curve of the negative-characteristic element while attaining the above object (1).

(3) To reduce the occupied area of the negative-characteristic element to improve circuit density of a semiconductor integrated circuit device while at the same time achieving the above object (1) or (2).

(4) To make controlling of the negative characteristic of the negative characteristic element more reliable while attaining the above objective (2) or (3).

(5) To form SRAM memory cells using the negative characteristic elements while attaining the above object (1), (2), (3) or (4).

(6) To improve the circuit density of the SRAM while attaining the above objective (5).

These and other objects and novel features of the present invention will become apparent from the following descriptions and attached drawings.

Representative aspects of the present invention disclosed in this application may be briefly summarized as follows.

(1) The semiconductor integrated circuit device according to this invention comprises:
- a first insulated-gate field-effect transistor having a thin film structure and a first threshold voltage, the insulated-gate field-effect transistor including:
  - a silicon thin film formed over the principal plane of a substrate;
  - a source region, a channel forming region and a drain region arranged successively along the channel length in the silicon thin film; and
  - a gate electrode formed over or below the channel forming region of the silicon thin film with a gate insulating film interposed therebetween; and
- a second insulated-gate field-effect transistor formed of the same channel conductivity type as the first insulated-gate field-effect transistor, the second insulated-gate field-effect transistor having a thin film structure and a second threshold voltage different from the first threshold voltage of the first insulated-gate field-effect transistor, the gate electrode of the second insulated-gate field-effect transistor being electrically shorted to the gate electrode of the first insulated-gate field-effect transistor, the drain or source region of the second insulated-gate field-effect transistor being connected in series with the source or drain region of the first insulated-gate field-effect transistor.

(2) In the semiconductor integrated circuit device described in the means (1), the drain or source region of the first insulated-gate field-effect transistor with the thin film structure is supplied with a first power supply, the source or drain region of the second insulated-gate field-effect transistor is supplied with a second power supply lower than the first power supply, and the first threshold voltage of the first insulated-gate field-effect transistor is set higher than the second threshold voltage of the second insulated-gate field-effect transistor.

(3) In the semiconductor integrated circuit device described in the means (1) or (2), the channel forming region of the first thin-film, insulated-gate field-effect transistor and the channel forming region of the second thin-film, insulated-gate field-effect transistor are directly connected electrically with each other, with the source or drain region of the first insulated-gate field-effect transistor and the drain or source region of the second insulated-gate field-effect transistor eliminated.

(4) In the semiconductor integrated circuit device described in the means (1) or (2), the source or drain region of the first thin-film, insulated-gate field-effect transistor and the drain or source region of the second thin-film, insulated-gate field-effect transistor are integrally formed.

(5) In the semiconductor integrated circuit device described in the means (1), (2), (3) or (4), the first thin-film, insulated-gate field-effect transistor and the second thin-film, insulated-gate field-effect transistor are formed in an n-channel conductivity or a p-channel conductivity, the channel forming region of the first insulated-gate field-effect transistor is formed of a p-type semiconductor region or an n-type semiconductor region, the channel forming region of the second insulated-gate field-effect transistor is formed of an i-type semiconductor region, and the gate insulating film of the first insulated-gate field-effect transistor and the gate insulating film of the second insulated-gate field-effect transistor are both formed to the thickness of less than 100 nm.

(6) In the semiconductor integrated circuit device described in the means (1), (2), (3), (4) or (5), the drain or source region and the gate electrode of the first thin-film, insulated-gate field-effect transistor are connected to the first power supply through a resistive element which has a linearity in a current-voltage characteristic, are also connected to a data line through a transfer insulated-gate field-effect transistor whose gate electrode is connected to a word line, and are further connected to one electrode of an information storage capacitive element whose second electrode is connected to a third power supply; the source or drain region of the second insulated-gate field-effect transistor is connected to the second power supply lower than the first power supply; and the first insulated-gate field-effect transistor, the second insulated-gate field-effect transistor, the transfer insulated-gate field-effect transistor, the resistive element, and the information storage capacitive element all combine to form a memory cell of a static random access memory to store information.

(7) In the semiconductor integrated circuit device described in the means (6), the transfer insulated-gate field-effect transistor in the SRAM memory cell has the source region, the channel forming region and the drain region thereof formed on the principal plane of a monocrystalline silicon substrate; the first insulated-gate field-effect transistor and the second insulated-gate field-effect transistor use either the source or drain region of the transfer insulated-gate field-effect transistor as their gate electrodes, and also have the source region, the channel forming region and the drain region thereof formed in a silicon thin film which is formed over either the source or drain region of the transfer insulated-gate field-effect transistor with a gate insulating film interposed therebetween; and the information storage capacitive element is a junction capacitance formed between either the source or drain region of the transfer insulated-gate field-effect transistor and the monocrystalline silicon substrate.

The above means (1) offers the following functions and advantages in the semiconductor integrated circuit devices.

(A1) Both the first and second thin-film, insulated-gate field-effect transistors exhibit a negative characteristic in which when the transistors are not conducting, the interband tunneling current caused by an electric field at the drain end is dominant and as the gate voltage increases, the electric field at the drain end is alleviated, reducing the current. When the gate voltage is further increased, the ON current flows increasing the current. That is, in the current-voltage characteristic, a minimum current region exists for a specified gate voltage. By changing the second threshold voltage of the second insulated-gate field-effect transistor with respect to the first threshold voltage of the first insulated-gate field-effect transistor and by electrically connecting the first and second insulated-gate field-effect transistors in series, it is possible to produce two negative characteristic curves with different voltage values for the minimum current regions. In a coupled portion of the two negative characteristic curves of the first and second insulated-gate field-effect transistors, a maximum current region exists in which the rate of change of current turns from positive to negative as the voltage increases. As a result, a total of two minimum current regions and one maximum current region can be obtained in the combined negative characteristic curve.

(B1) The channel forming regions of the first and second insulated-gate field-effect transistors with thin-film structure are formed by the single layer of silicon thin film. These channel forming regions can be set with different threshold voltages—first and second threshold voltages—simply by controlling the impurity concentrations. Hence, the negative characteristic curve with two minimum current regions and one maximum current region, mentioned in (A1), can be obtained with simple techniques.

(C1) Both the first and second thin-film, insulated-gate field-effect transistors, which together produce a negative characteristic with two minimum current regions and one maximum current region as mentioned in (A1), have their channel forming regions, source regions and drain regions formed of a silicon thin film. This improves alignment of these transistors in the so-called silicon devices where elements are formed on the principal plane of the single-crystal silicon substrate.

With the above-mentioned means (2), the following functions and advantages in addition to those offered by the means (1) can be produced in the semiconductor integrated circuit devices.

(A2) In the negative characteristic curve of the current-voltage characteristic of the first thin-film, insulated-gate field-effect transistor, since the inclination at which the current decreases due to the tunneling current can be set large, it is possible to increase the current difference between the minimum current region of the first insulated-gate field-effect transistor and the maximum current region formed at a joint portion between the two negative characteristic curves of the first and second insulated-gate field-effect transistors.

(B2) In the negative characteristic curve of the current-voltage characteristic of the second thin-film, insulated-gate field-effect transistor, since the inclination at which the current decreases due to the tunneling current can be made small by setting the second threshold voltage smaller than the first threshold voltage of the first insulated-gate field-effect transistor, it is possible to reduce the current change caused by voltage change.

With the above-mentioned means (3), the following functions and advantages in addition to those offered by the means (1) or (2) can be produced in the semiconductor integrated circuit devices. The area occupied by the source or drain regions of the first and second insulated-gate field-effect transistors are reduced, which in turn reduces the combined overall occupied area of the first and second insulated-gate field-effect transistors.

With the above-mentioned means (4), the following functions and advantages in addition to those offered by the means (1) or (2) can be produced in the semiconductor integrated circuit devices.

(A3) The occupied area of either source or drain region of the first thin-film, insulated-gate field-effect transistor is made to overlap the occupied area of either the drain or source region of the second thin-film, insulated-gate field-effect transistor. Hence, the total occupied area of the first and second insulated-gate field-effect transistors can be reduced by an amount equal to one of these occupied areas, which, in turn, improves circuit density of the device.

(B3) A junction is formed between the channel forming region and the source or drain region of the first thin-film, insulated-gate field-effect transistor and also between the channel forming region and the drain or source region of the second thin-film, insulated-gate field-effect transistor, allowing reliable control of the impurity concentrations in each region. This in turn enables reliable control of the negative characteristic.

With the above-mentioned means (6), the following functions and advantages in addition to those offered by the means (1) through (4) can be produced in the semiconductor integrated circuit devices.

(A4) In the current-voltage characteristic, three stable points exist at intersections that are formed by a straight line of the current-voltage characteristic of the resistive element passing through the current increasing and decreasing regions of the negative characteristic curve of the first thin-film, insulated-gate field-effect transistor and through the current increasing region of the negative characteristic curve of the second, thin-film insulated-gate field-effect transistor. These three stable points can be used as a low level, an intermediate level and a high level for the information storage node region in a memory cell. This allows the use of memory cell as an SRAM memory cell.

(B4) With the above SRAM memory cell, a single memory cell requires only one each of the first insulated-gate field-effect transistor, the second insulated-gate field-effect transistor, the transfer insulated-gate field-effect transistor, the resistive element and the information storage capacitive element, reducing the occupied area of the memory cell to almost half that of the conventional memory. Therefore, the integration level of the SRAM can be enhanced.

With the above-mentioned means (7), the following functions and advantages in addition to those offered by the means (6) can be produced in the semiconductor integrated circuit devices. Since in the SRAM memory cell the occupied area of either the source or drain region of the transfer insulated-gate field-effect transistor is overlapped by the occupied areas of the first insulated-gate field-effect transistor, the second insulated-gate field-effect transistor and the information storage capacitive element, the integration level of the SRAM can be improved.

Now, the present invention will be described in detail in conjunction with one embodiment that applies this invention to an SRAM memory.

In all figures used for explaining embodiments, components with the same functions are assigned like reference numerals, and their repetitive descriptions are omitted.

BRIEF DESCRIPTION OF THE DRAWINGS

FIG. 20 is a plan view of the memory cell in the third process of manufacture;

FIG. 21 is a plan view of the memory cell in the fourth process of manufacture;

BRIEF DESCRIPTION OF THE PREFERRED EMBODIMENTS (Embodiment 1)

First, let us explain briefly the outline of the present invention.

Figure 1:
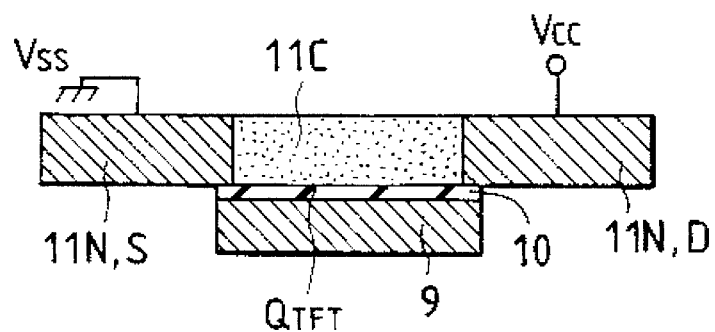
FIG. 1 is a cross section showing the basic structure of the MISFET with a TFT structure.

The basic structure of an MISFET (Metal-Insulator-Semiconductor Field Effect Transistor) $Q_{TFT}$ with a thin-film transistor (TFT) structure is shown in FIG. 1 (a modeled cross section). The current-voltage characteristic of this MISFET $Q_{TFT}$ is shown in FIG. 2.

As shown in FIG. 1, the MISFET $Q_{TFT}$ that employs the thin-film transistor (TFT) structure has a channel forming region 11C over the gate electrode 9 with a gate insulating film 10 formed therebetween and with a drain region (D) 11N formed at one end of the channel forming region 11C and a source region (S) 11N at the other. The drain region (D) 11N, the channel forming region 11C and the source region (S) 11N are each formed of a polycrystalline silicon film 11 deposited over the surface of the gate insulating film 10. In the SRAM memory cell M of this embodiment, the gate electrode 9 is provided by an n+—type semiconductor region 9—which is the other semiconductor region of a transfer MISFET $Q_T$—and therefore is situated in a conductive layer underlying the polycrystalline silicon film.

Figure 2:
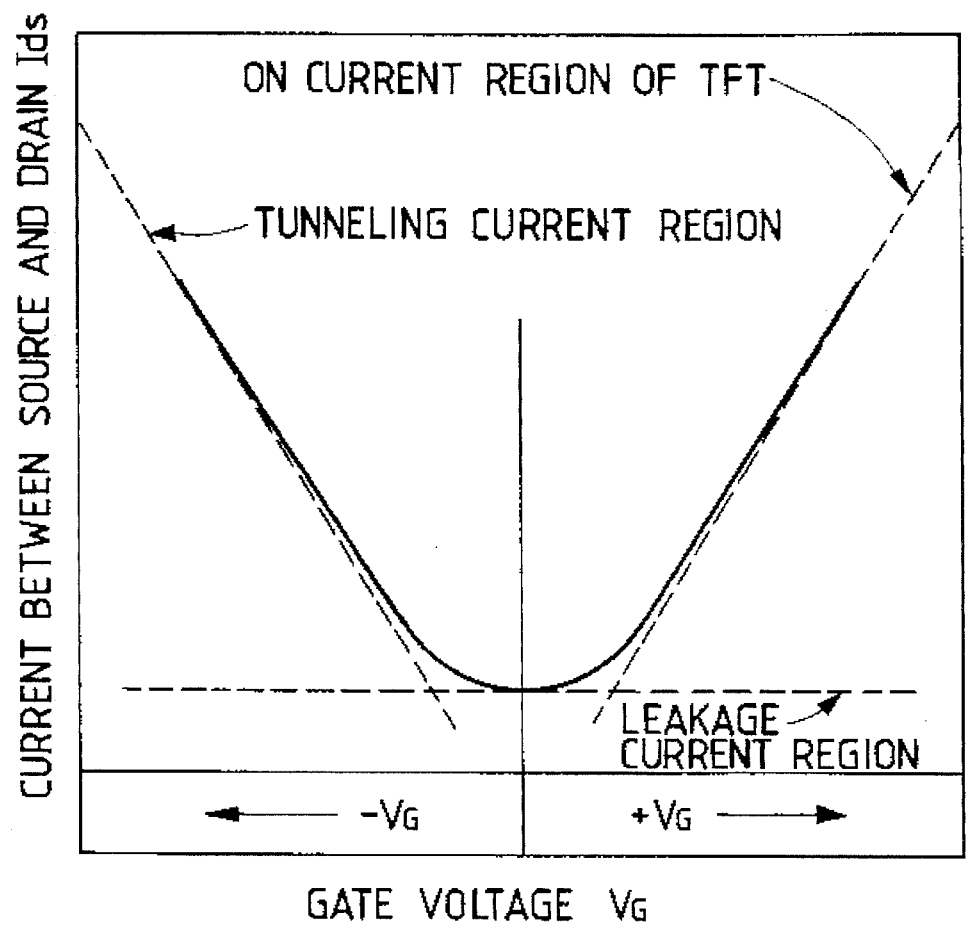
FIG. 2 is a current-voltage characteristic diagram for the MISFET with the TFT structure of FIG. 1.

The MISFET $Q_{TFT}$ with TFT structure exhibits a negative characteristic in the current-voltage characteristic (i.e. it has a negative resistance curve), as shown in FIG. 2.

The MISFET $Q_{TFT}$ uses a polycrystalline silicon film for the channel forming region 11C, characteristic of the TFT structure. As the intensity of electric field generated between the gate electrode 9 and the drain region 11N increases according to the crystal grains of the polycrystalline silicon film, a tunneling current becomes more likely to flow between the drain region 11N and the channel forming region 11C. That is, the negative characteristic curve has a tunneling current region (i.e. it has a region where an interband tunneling current becomes dominant). The tunneling current region is such that as the voltage applied to the gate electrode 9 increases, the electric field at the end of the drain is mitigated, reducing the amount of current flowing between the source and drain regions.

As the voltage impressed to the gate electrode 9 is further increased, the negative characteristic curve passes a minimum current region where there is no inclination (where the differential coefficient is zero) and reaches an ON current region. In the ON current region, the amount of current flowing between the source region and the drain region increases proportionally with the voltage applied to the gate electrode 9.

The channel forming region 11C of the MISFET $Q_{TFT}$ is formed of a polycrystalline silicon film. According to the crystal grains of the polycrystalline silicon film, a small current flows between the source region and the drain region. That is, since the negative characteristic curve has a leakage current region, the source-drain current does not become zero even when the gate electrode 9 is not applied with a voltage.

Figure 3A:
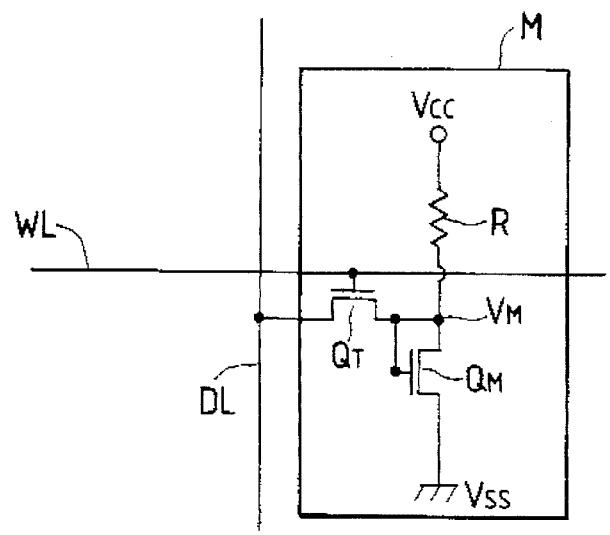
FIG. 3A is a circuit diagram showing the concept of the SRAM memory cell of the present invention.

The inventors have found that utilizing the negative characteristic of the MISFET $Q_{TFT}$ that uses the above-mentioned TFT structure makes it possible to form a negative characteristic element as an information storage section of the SRAM memory cell. FIG. 3A shows an SRAM memory cell M of this invention.

As shown in FIG. 3A, an SRAM memory cell M for storing one bit of information is arranged at an intersection between a data line DL and a word line WL. The memory cell M is made up of one transfer MISFET (Metal Insulator Semiconductor Field-Effect Transistor) $Q_T$ for selecting a cell and an information storage section. The information storage section comprises a negative characteristic MISFET $Q_M$ as a negative characteristic element (e.g., negative resistance element) and a resistive element R.

The transfer MISFET $Q_T$ in the memory cell M has one of its semiconductor regions connected to the data line DL and the other to an information storage node region $V_M$ in the information storage section. The gate electrode of the transfer MISFET $Q_T$ is connected to the word line WL. The transfer MISFET $Q_T$ is formed of an n-channel conductivity semiconductor.

The negative characteristic MISFET $Q_M$ has its drain region connected to the information storage node region $V_M$. The source region of the negative characteristic MISFET $Q_M$ is connected to a reference voltage $V_{ss}$. The reference voltage $V_{ss}$ may use a ground potential 0 V of the circuit, for example. The negative characteristic MISFET $Q_M$ is connected to the information storage node region $V_M$.

A resistive element R has a linearity in the current-voltage characteristic. The resistive element R has one end connected to the information storage node region $V_M$ and the other to the supply voltage $V_{cc}$.

Figure 3B:
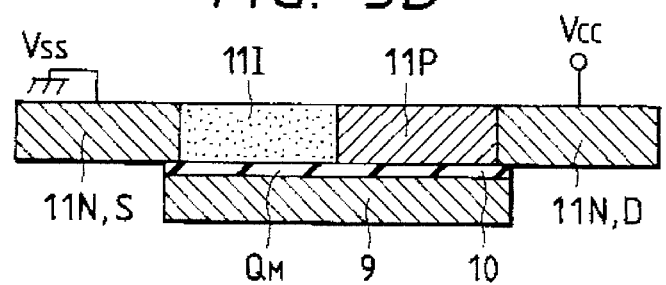
FIG. 3B and 3D are cross sections showing the basic structures of a load element of this invention.
Figure 3C:
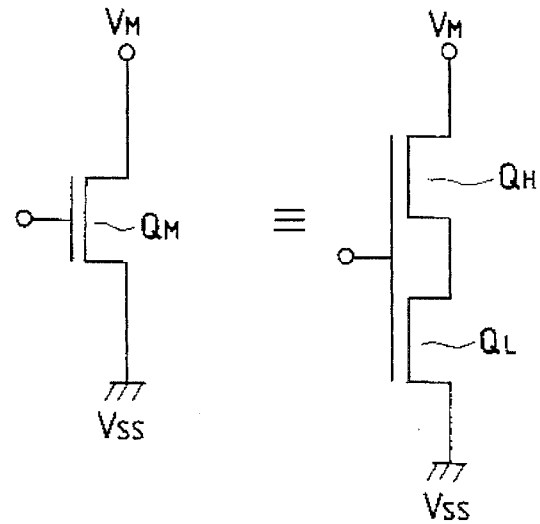
FIG. 3C is an equivalent circuit for a negative characteristic element.

The negative characteristic MISFET $Q_M$ adopts a TFT structure as shown in FIG. 3B (modeled cross section), different from the MISFET $Q_{TFT}$ Of FIG. 1 in the structure of the channel forming region.

The negative characteristic MISFET $Q_M$ has channel forming regions 11I, lip over the gate electrode 9 with a gate insulating film 10 interposed therebetween, with a drain region (D) 11N formed at one end of the channel forming regions 11I, 11P and a source region (S) 11N at the other end. The drain region 11N, channel forming regions 11I, 11P, and source region 11N are each formed of a polycrystalline silicon film 11 deposited over the surface of the gate insulating film 10.

The channel forming region 11P is formed of a polycrystalline silicon film doped with a p-type impurity, and the channel forming region 11I uses a polycrystalline silicon film formed as a non-doped polysilicon layer. The source-drain regions 11N are formed of a polycrystalline silicon film doped with an n-type impurity.

Figure 4:
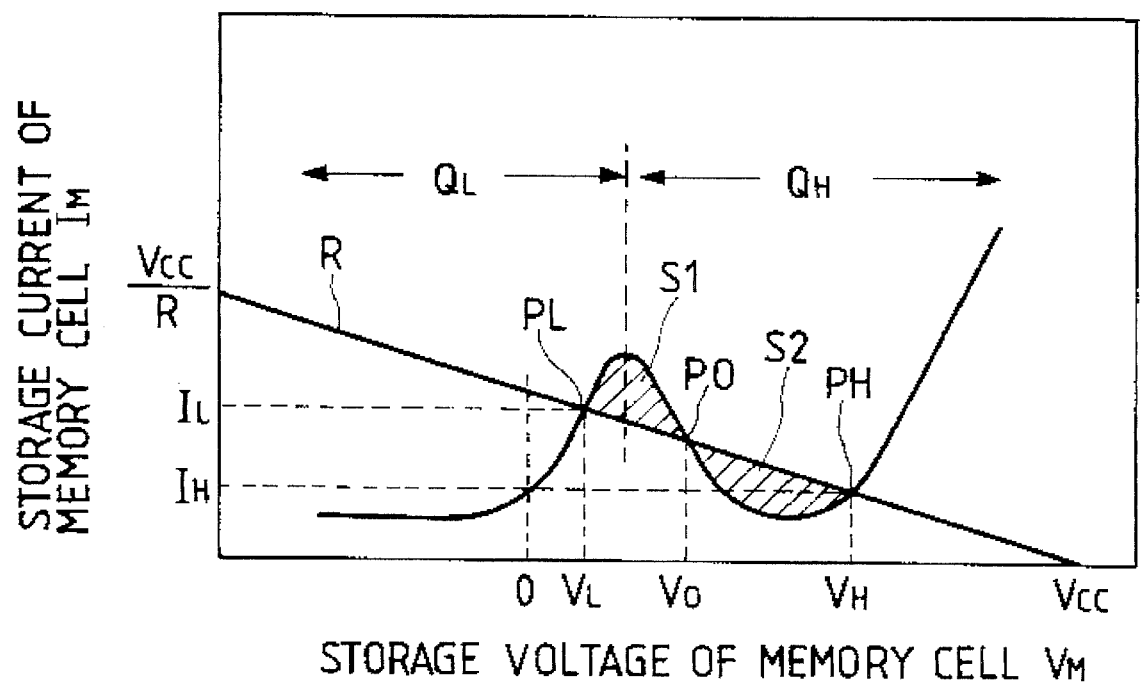
FIG. 4 is a current-voltage characteristic of the negative characteristic element.

The negative characteristic MISFET $Q_M$ with the above construction can be deemed as consisting of two MISFETs $Q_L$ and $Q_H$ with different threshold voltages. That is, the threshold voltage of the negative characteristic MISFET $Q_H$ is set higher than that of the negative characteristic MISFET $Q_L$. The current-voltage characteristics of the negative characteristic MISFETs $Q_L$ and $Q_H$ are shown in FIG. 4. In the following description, the negative characteristic MISFETs $Q_L$, $Q_H$ are take up as examples.

As shown in the current-voltage characteristic of FIG. 4, the negative characteristic curve (e.g., negative resistance curve) of the negative characteristic MISFET $Q_H$ has a minimum current region set at a high voltage portion of the curve because the threshold voltage is set high. As for the negative characteristic MISFET $Q_L$, on the contrary, the minimum current region is set at a low voltage portion of the negative characteristic curve because the threshold voltage is set low. Since the negative characteristic MISFETs $Q_H$, $Q_L$ are connected in series, the negative characteristic curves (e.g., negative resistance curves) of the negative characteristic MISFETs $Q_H$ and $Q_L$ are coupled together. That is, the ON current region of the negative characteristic MISFET $Q_L$ and the tunneling current region of the negative characteristic MISFET $Q_H$ are coupled in the negative characteristic curve. Therefore, the connected portion of the two negative characteristic curves forms a maximum current region where the inclination of the curve becomes zero (the differential coefficient is zero).

Since the threshold voltage of the negative characteristic MISFET $Q_H$ is set high, the inclination of the combined negative characteristic curve of the negative characteristic MISFET $Q_H$ in the tunneling current region can be made large, increasing the current difference between the maximum current region in the connected portion and the minimum current regions. When the current difference between the maximum current region and the minimum current regions in the negative characteristic curve is large (when the shaded areas S1, S2 enclosed by the negative characteristic curve and the resistive element R are large), the noise margin of charges stored as information in the information storage node region of the memory cell M can be improved.

Conversely, in the combined negative characteristic curve, since the threshold voltage of the negative characteristic MISFET $Q_L$ is set high minimizing the effect of the field from the gate electrode 9, the inclination of the combined negative characteristic curve of the negative characteristic MISFET $Q_L$ in the tunneling current region can be made small.

The combined negative characteristic curve, as shown in FIG. 4, has three stable points (operation points) PL, PO and PH where the voltage and current values are held constant, at intersections between it and the inclined line of the current-voltage characteristic of the resistive element R. These three stable points PL, PO, PH correspond to a low level, an intermediate level and a high level and constitute information to be stored in the information storage node region $V_M$ of the memory cell M. In this way, the memory cell M can store information "1" and "0."

The outline of the present invention has been briefly explained.

Now, the embodiment 1 of the invention will be described in detail.

Figure 5:
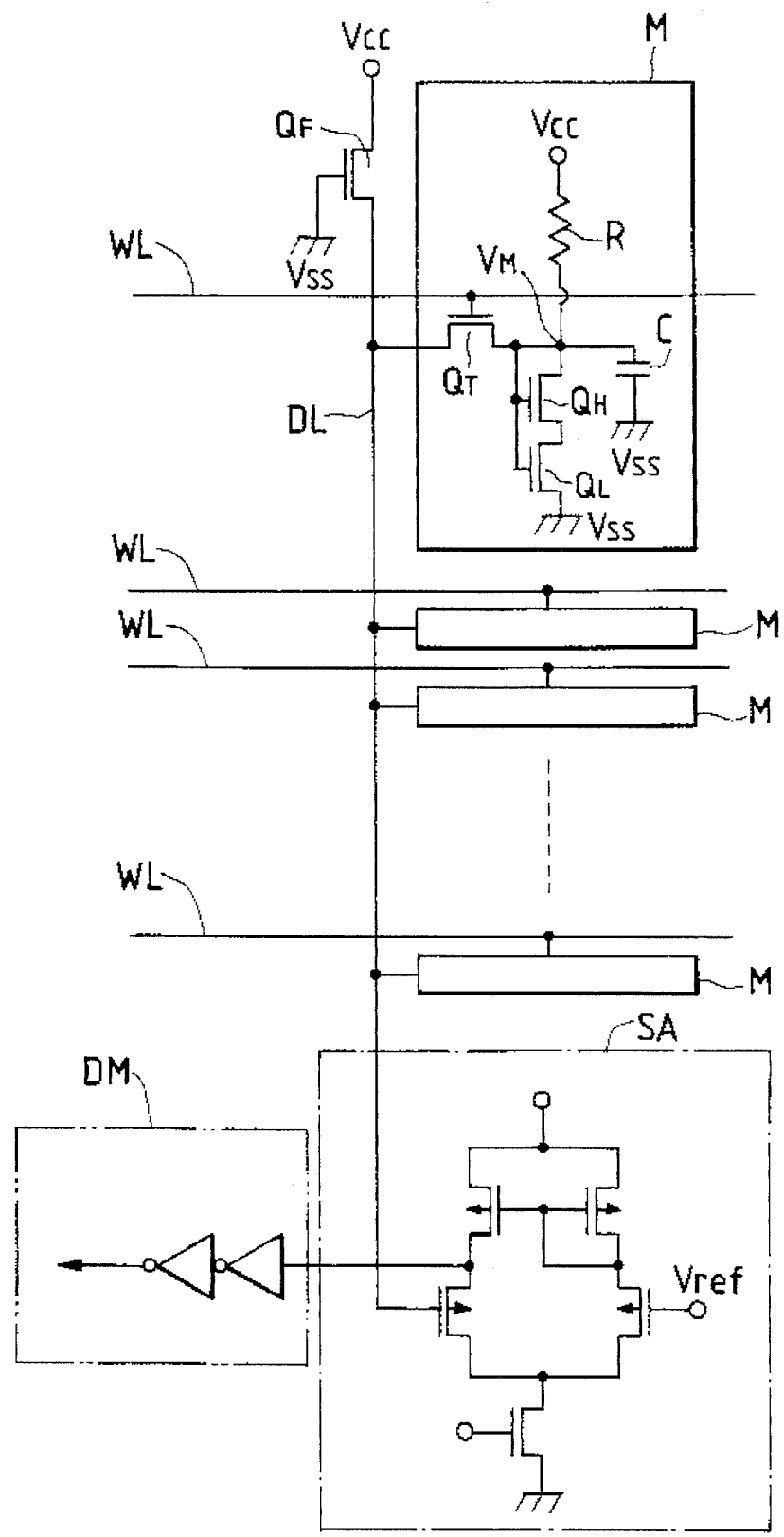
FIG. 5 is a circuit block diagram of an SRAM as the first embodiment of this invention.

The system configuration of an SRAM as the first embodiment of this invention is shown in FIG. 5 (circuit block diagram).

As shown in FIG. 5, one memory cell of SRAM that stores one bit of information is arranged at each intersection of data lines DL and word lines WL. The memory cell M includes a transfer MISFET (Metal Insulator Semiconductor Field Effect Transistor) $Q_T$ and an information storage section.

The transfer MISFET $Q_T$ of the memory cell M has one of its semiconductor regions connected to the data line DL and the other to an information storage node region $V_M$ in the information storage section. The gate electrode of the transfer MISFET $Q_T$ is connected to the word line WL. The transfer MISFET $Q_T$ is formed of a semiconductor of an n-channel conductivity.

The information storage section of the memory cell M includes a total of four elements—negative characteristic MISFETs $Q_H$ and $Q_L$, resistive element R and information storage capacitive element C.

The negative characteristic produced by the negative characteristic MISFETs $Q_H$, $Q_L$ will be detailed later. The negative characteristic MISFETs $Q_H$, $Q_L$ are each formed of a semiconductor of n-channel conductivity. The source region of the negative characteristic MISFET $Q_H$ is connected in series with the drain region of the negative characteristic MISFET $Q_L$. The drain region of the negative characteristic MISFET $Q_H$ is connected to the information storage node region $V_M$. The source region of the negative characteristic MISFET $Q_L$ is connected to the reference voltage $V_{ss}$. The reference voltage $V_{ss}$ may use the ground potential 0 V of the circuit, for example. The gate electrodes of the negative characteristic MISFETs $Q_H$, $Q_L$ are electrically shorted and connected to the information storage node region $V_M$.

The current-voltage characteristic of the resistive element. R has a linearity. The resistive element R has one end thereof connected to the information storage node region $V_M$ and the other to the supply voltage $V_{cc}$. The supply voltage $V_{cc}$ may use the operation voltage 5 V of the circuit, for example. When the SRAM is provided with a step-down power supply circuit, a stepped-down voltage of 3 V to 3.3 V is used.

The information storage capacitive element C has one of its electrodes connected to the information storage node region $V_M$ and the other to the reference voltage $V_{ss}$. The information storage capacitive element C accumulates and holds a charge as information stored in the memory cell M.

A plurality of memory cells M are arranged along the length of each data line DL and also are arranged along the length of each word line WL that intersects the data lines DL, thus forming a memory array.

In FIG. 5, one end of each data line DL is connected to the supply voltage $V_{cc}$ through a data line load MISFET $Q_F$. The other end of the data line DL is connected to a sense amplifier SA. The sense amplifier SA is selected by a decoder not shown. The sense amplifier SA supplies its output to an output amplifier DM, from which it is issued as an SRAM output through an output buffer not shown.

The word line WL is selected by a decoder via a word driver not shown.

Next, a detailed structure of the SRAM memory cell M will be described by referring to FIG. 6 (a plan view of the memory cell) and FIG. 7 (a cross section taken along the line A—A of FIG. 6).

Figure 6:
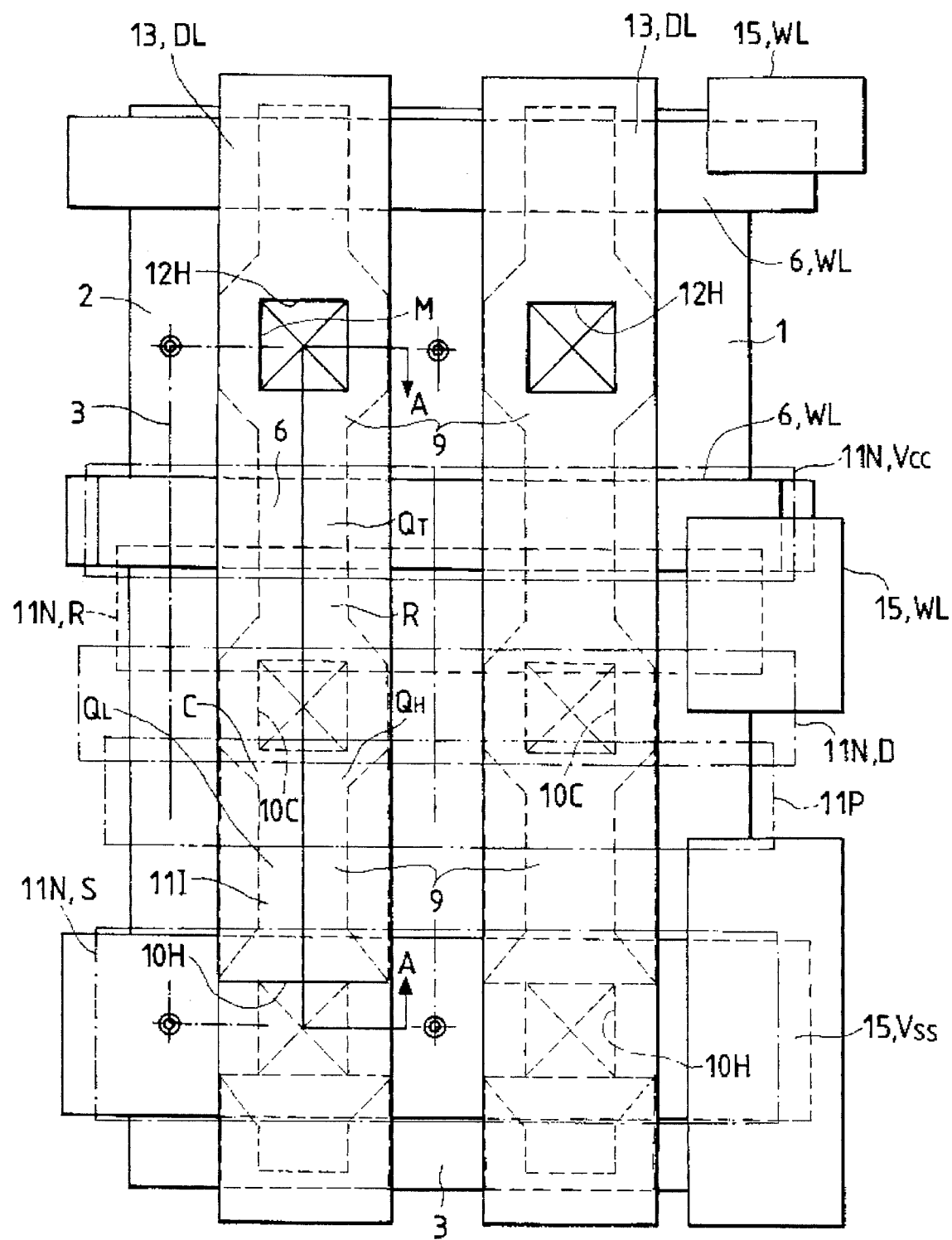
FIG. 6 is a plan view of the SRAM memory cell of the first embodiment of the invention.
Figure 7:
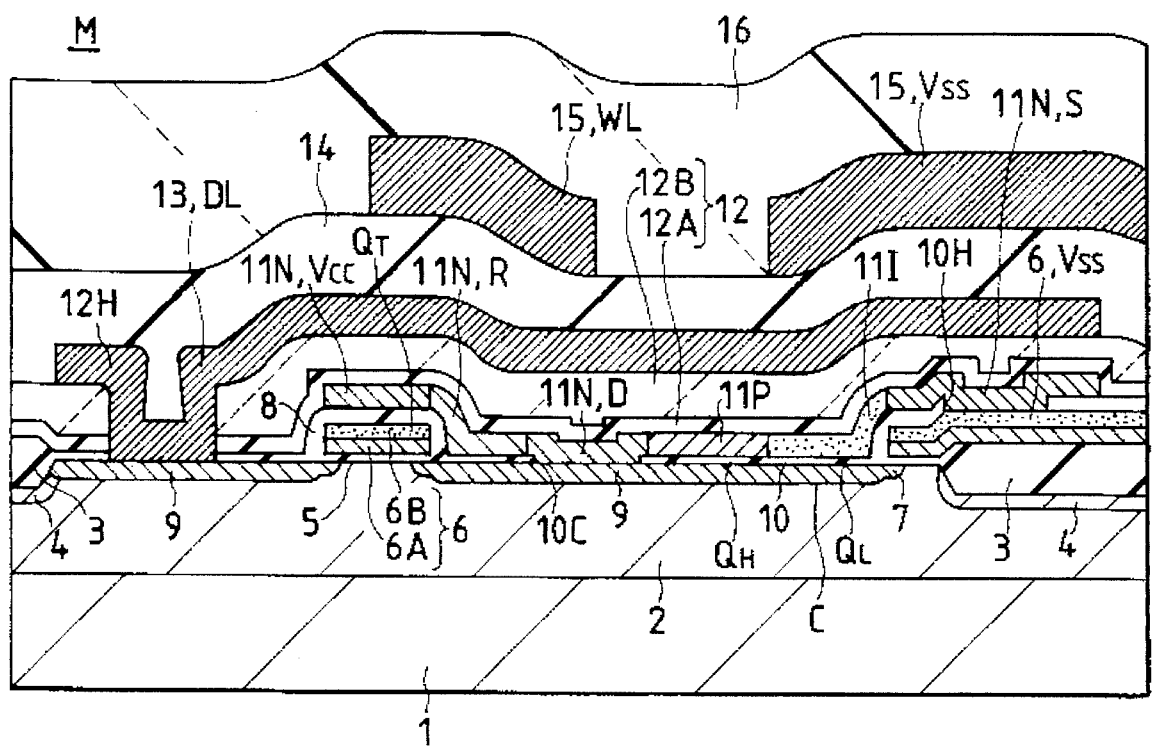
FIG. 7 is a cross section of a memory cell.

As shown in FIG. 6 and FIG. 7, the SRAM is formed mainly of a p⁻-type semiconductor substrate 1, which is made of a monocrystal silicon. The p⁻-type semiconductor substrate 1 has a region in which to place the memory cell array and a region in which to put n-channel MISFETs of such direct and indirect peripheral circuits as sense amplifier and decoder. In these regions, p⁻-type well regions 2 are formed. Though not shown, the p⁻-type semiconductor substrate 1 also has a region in which to place p-channel MISFETs of direct and indirect peripheral circuits. In the p-channel MISFET region, an n⁻-type well region 2 is formed.

The transfer MISFET $Q_T$ of the memory cell M, as shown in FIG. 6, 7, 8 (a plan view in the first process) and 9 (a plan view in the second process), is formed over the principal plane of the p⁻-type well region 2 in the active region enclosed by an element isolation insulating film 3 and a p-type channel stopper region 4. That is, the transfer MISFET $Q_T$ includes mainly the p⁻-type well region 2 (channel forming region), a gate insulating film 5, a gate electrode 6, a pair of n-type semiconductor regions 7 and a pair of n⁺-type semiconductor region 9, these paired regions being used as source and drain regions.

The gate insulating film 5 may, for example, be a silicon oxide film which is formed by a thermal oxidation method.

In this embodiment, the gate electrode 6 is formed as a polyside, which consists of a WSi₂ film 6B laminated over a polycrystalline silicon film 6A. The lower layer or the polycrystalline silicon film 6A may for example be deposited by the CVD (chemical vapor deposition) method, during which or after which an n-type impurity is introduced to reduce the resistance. The polycrystalline silicon film 6A may be formed to the thickness of 80 to 120 nm. The upper layer of the gate electrode 6, the WSi₂ film 6B, may be deposited by sputtering or CVD method to the thickness of 130 to 170 nm. The WSi₂ film 6B has a smaller specific resistance than that of the polycrystalline silicon film 6A and thus contributes to reducing the overall resistance of the gate electrode 6. The gate electrode 6 is connected integrally and electrically with the word line (WL) 6 over the gate width.

Figure 9:
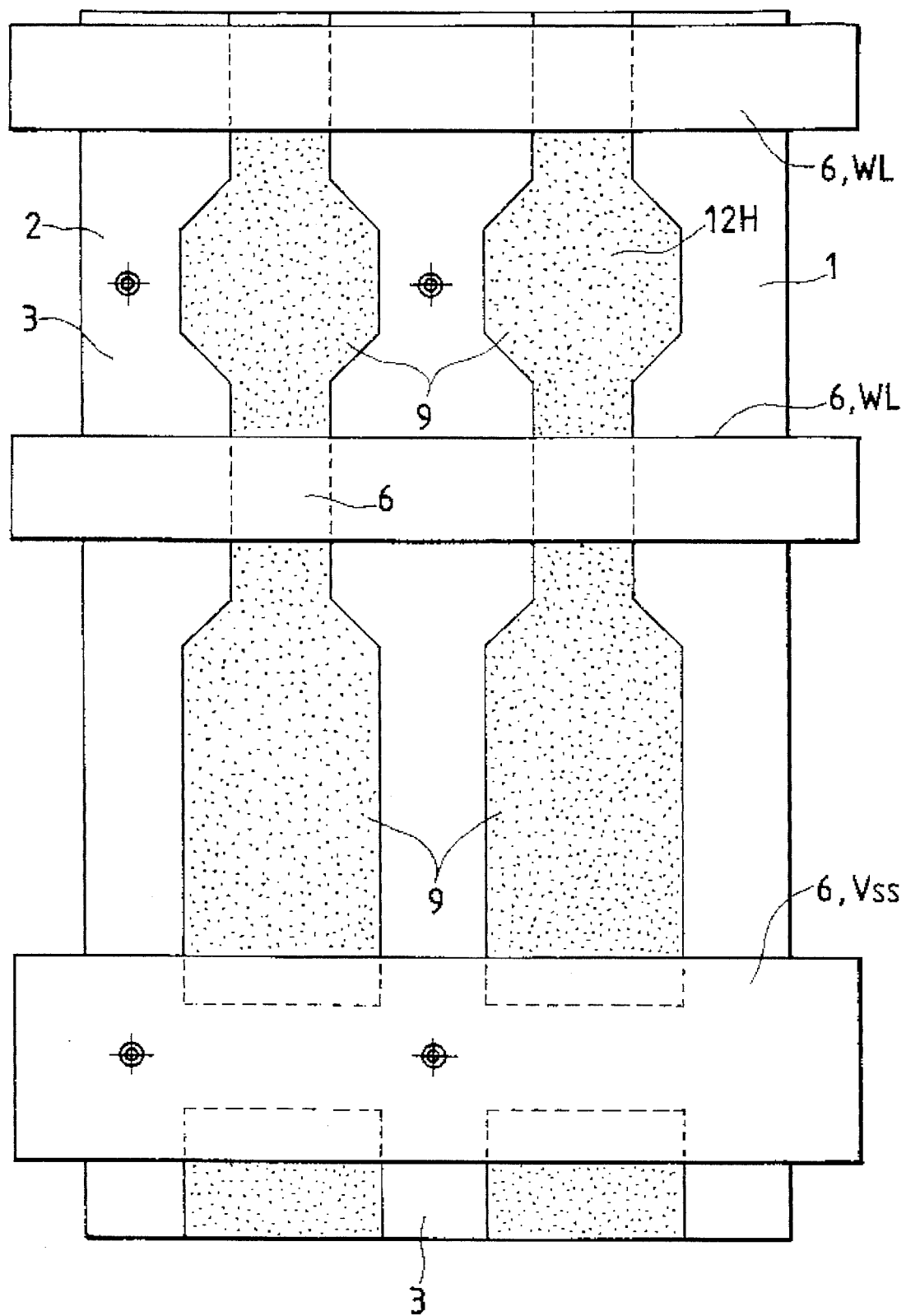
FIG. 9 is a plan view of the memory cell in the second process of manufacture.

As shown in FIG. 7 and 9, the reference voltage line ($V_{ss}$) 6 is formed in the same conductive layer as the gate electrode 6 and the word line 6. The reference voltage line 6 is arranged on the element isolation insulating film 3 and is parallelly spaced a specified distance from the word line 6. It also extends in the same direction as the word line 6.

The lightly doped n-type semiconductor region 7 is integrally formed and electrically connected with the highly doped n⁺-type semiconductor region 9 on the channel forming region side of the n⁺-type semiconductor region 9. The n-type semiconductor region 7 constitutes the transfer MISFET $Q_T$ with an LDD (Lightly Doped Drain) structure. The highly doped n⁺-type semiconductor region 9 is designed mainly to reduce its own resistance and connection resistance with the data line (DL) 13.

Figure 10:
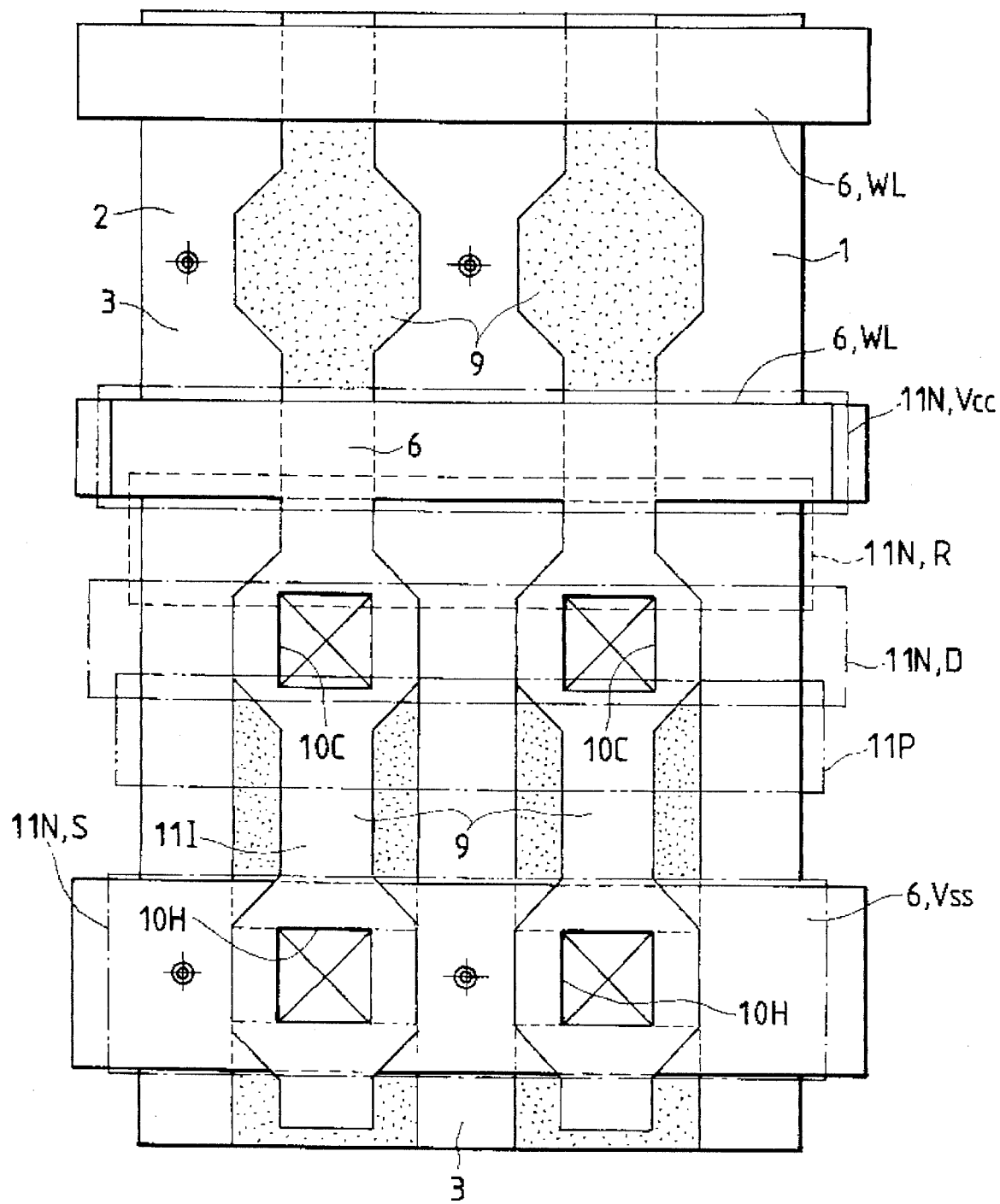
FIG. 10 is a plan view of the memory cell in the third process of manufacture.

As shown in FIG. 6, 7 and 10 (a plan view in the third process), the negative characteristic MISFETs $Q_H$, $Q_L$ in the information storage section of the memory cell M overlap the second semiconductor region of the transfer. MISFET $Q_T$ and are virtually formed on top of the transfer MISFET $Q_T$. That is, the negative characteristic MISFET $Q_H$ consists mainly of the gate electrode 9, the gate insulating film 10, the channel forming region 11P and the drain region (D) 11N. The negative characteristic MISFET $Q_L$ consists mainly of the gate electrode 9, the gate insulating film 10, the channel forming region 11I, and the source region (S) 11N.

The gate electrode 9 of the negative characteristic MISFETs $Q_H$, $Q_L$ is formed of the n⁺-type semiconductor region 9 that constitutes the second semiconductor region of the transfer MISFET $Q_T$. The gate insulating film 10 is formed over the surface of the n⁺-type semiconductor region 9. The gate insulating film 10 is formed of a silicon oxide film deposited by a low-pressure CVD method to the thickness of 15 to 25 nm. When formed of the silicon oxide film, the gate insulating film 10 is required to be deposited to the thickness of less than 100 [nm] so as to produce a sufficient field effect from the gate electrode 9 in the channel forming region 11P of the negative characteristic MISFET $Q_H$ and in the channel forming region 11I of the negative characteristic MISFET $Q_L$.

The channel forming region 11P and the drain region 11N of the negative characteristic MISFET $Q_H$ are formed in a polycrystalline silicon film 11 over the n⁺-type semiconductor region 9 with the gate insulating film 10 interposed therebetween. That is, the channel forming region 11P is formed by the polycrystalline silicon film doped with a p-type impurity, while the drain region 11N is formed by the polycrystalline silicon film doped with an n-type impurity. The polycrystalline silicon film that forms the channel forming region 11P and the drain region 11N may be deposited by the CVD method to the thickness of 30 to 50 nm. When the deposition process is finished, the polycrystalline silicon film is obtained as a so-called non-doped polysilicon film with no impurity introduced.

The channel forming region 11P is doped with a p-type impurity, such as BF₂, in order to have a threshold voltage higher than that of the negative characteristic MISFET $Q_L$. Doping of BF₂ may be done by the ion implantation in the impurity concentration of about 2×10¹² to 5×10¹³ atoms/cm² by using an energy of about 20–40 KeV. Under this condition, the negative characteristic MISFET $Q_H$ can be set with a threshold voltage of 2–3 IV, for example. In either FIG. 6 or 10, a mask (photoresist mask) for introducing the p-type impurity into the channel forming region 11P is shown by two-dot line and by reference numeral 11P.

The drain region 11N is doped with an n-type impurity, such as As, at high concentration to reduce its own resistance and the connection resistance with other elements. The As may be introduced by the ion implantation at the impurity concentration of 1×10¹⁵ to 2×10¹⁵ atoms/cm² by using an energy of 20–40 KeV. In either FIG. 1 or FIG. 5, a mask (photoresist mask) for introducing the n-type impurity into the drain region 11N is represented by one-dot line and by reference numeral 11N.

The drain region 11N makes an electrical connection with the n⁺-type semiconductor region 9, which corresponds to the second semiconductor region of the transfer MISFET $Q_T$, through a connection hole 10C formed in the gate insulating film 10.

The source region 11N of the negative characteristic MISFET $Q_H$ is eliminated to reduce the occupied area of the memory cell M, and the channel forming region 11P is directly connected to the channel forming region 11I of the negative characteristic MISFET $Q_L$.

The channel forming region 11I of the negative characteristic MISFET $Q_L$ is formed in the same polycrystalline silicon film 11 that is formed over the n⁺-type semiconductor region 9 with the gate insulating film 10 interposed therebetween. The channel forming region 11I is formed basically of a polycrystalline silicon film not doped with either type of impurity, p-type or n-type, i.e. a so-called intrinsic semiconductor. The negative characteristic MISFET $Q_L$ may be set with a threshold voltage of, for example, 0 to 1.0 V. The source region 11N is formed in the polycrystalline silicon film 11, which overlies the reference power supply line 6 with the insulating film 10 interposed therebetween. That is, the source region 11N is formed of a polycrystalline silicon film doped with an n-type impurity.

The channel forming region 11I uses as is the polycrystalline silicon film formed as a non-doped polysilicon layer, in order to have a threshold voltage lower than that of the negative characteristic MISFET $Q_H$.

The source region 11N, like the drain region 11N of the negative characteristic MISFET $Q_H$, is doped with an n-type impurity at high concentration in order to reduce its own resistance and the connection resistance with other elements. The source region 11N makes electrical connection with the reference power supply line 6 through a connection hole 10H formed in the insulating film 10.

The drain region 11N of the negative characteristic MISFET $Q_L$ is eliminated for the purpose of reducing the occupied area of the memory cell M, allowing the channel forming region 11I to be directly connected to the channel forming region 11P of the negative characteristic MISFET $Q_H$.

The major portion of the negative characteristic MISFETs $Q_H$, $Q_L$ is formed in the polycrystalline silicon film 11 that is deposited over the principal plane of the p⁻-type semiconductor substrate 1 (actually the p⁻-type well region 2) and these MISFETs adopt the SOI or TFT structure.

The resistive element R in the information storage section of the memory cell M is formed over the second semiconductor region (n⁺-type semiconductor region 9) of the transfer MISFET $Q_T$ with the insulating film 10 interposed therebetween. The resistive element R is formed of the polycrystalline silicon film 11, the same conductive layer as the channel forming region 11P and the drain region 11N of the negative characteristic MISFET $Q_H$. One end of the resistive element R is formed integral with and electrically connected with the drain region 11N of the negative characteristic MISFET $Q_H$. The other end of the resistive element R is formed integral with and electrically connected with the supply voltage line $V_{cc}$) 11N. The supply voltage line 11N, as with the resistive element R, is formed of the same conductive layer as the aforementioned polycrystalline silicon film 11 and disposed overlapping the gate electrode 6 (word line 6).

The resistive element R is doped with a low concentration of n-type impurity, such as P. The P is ion-implanted at the impurity density of, for example, $1\times 10^{12}$ to $1\times 10^{13}$ atoms/cm² with the energy of 20 to 40 KeV. Under these conditions, the resistive element R can be set to $10^8$ to $10^{10}$ Ω. In FIG. 6 and 10, a mask for introducing the n-type impurity into the resistive element R is shown by broken lines and represented by reference numeral 11N and 11R. The resistive element R is also formed in the SOI or TFT structure.

The supply voltage line 11N is doped with a high concentration of n-type impurity, as in the case of the reference voltage line 11N.

The information storage capacitive element C in the information storage section of the memory cell M is formed of a pn junction (parasitic capacitance) between the n⁺-type semiconductor region 9 (gate electrode 9 of the negative characteristic MISFET $Q_H$, $Q_L$)—which constitutes the second semiconductor region of the transfer MISFET $Q_T$—and the p⁻-type well region 2.

Figure 11:
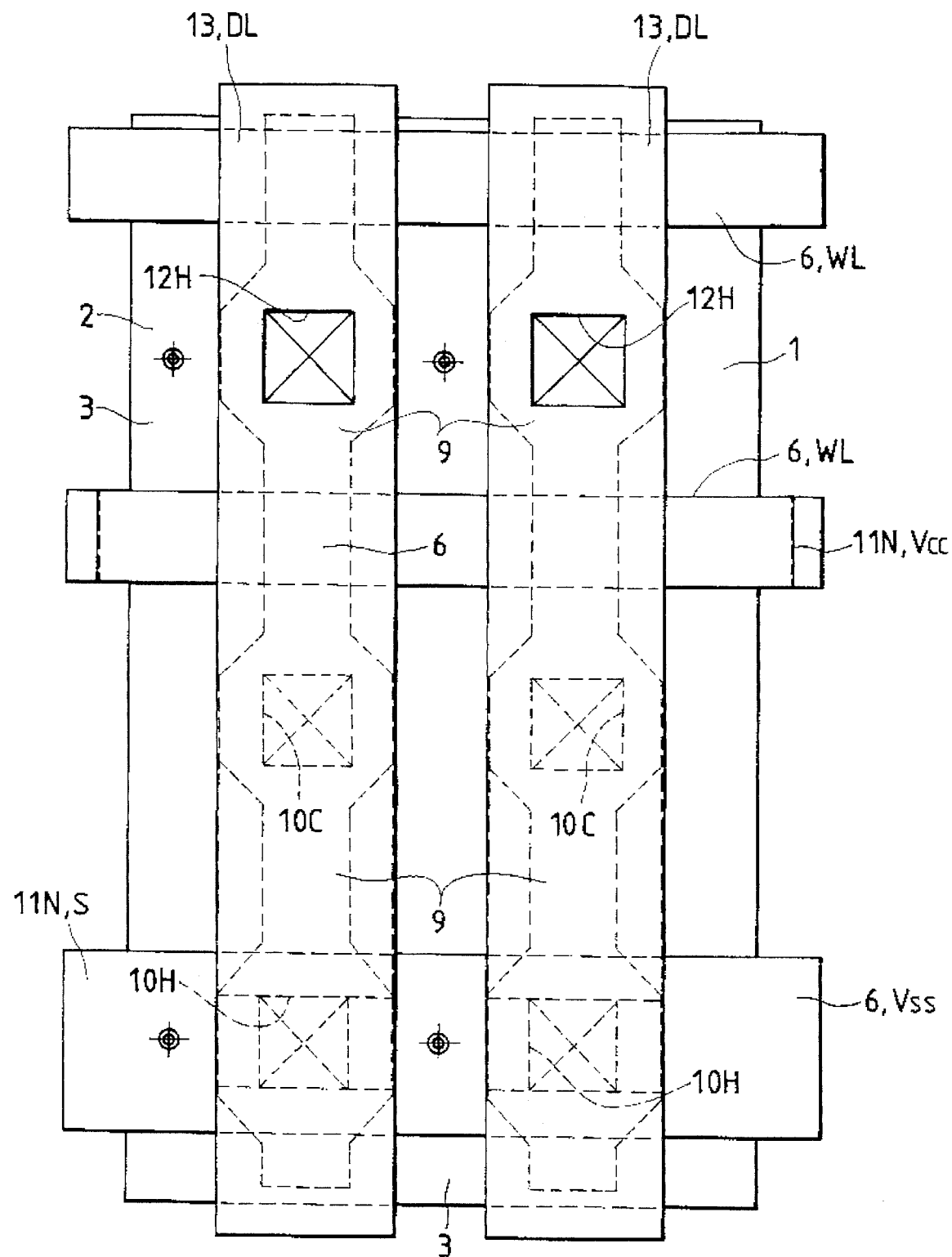
FIG. 11 is a plan view of the memory cell in the fourth process of manufacture.

As shown in FIG. 6, 7 and 11 (plan view in the fourth process), the n⁺-type semiconductor region 9 which corresponds to the first semiconductor region of the transfer MISFET $Q_T$ in the memory cell M is electrically connected with a data line (DL) 13. The data line 13 extends over an interlayer insulating film 12 and makes connection with the n⁺-type semiconductor region 9 through a connection hole 12H formed in the interlayer insulating film 12.

The interlayer insulating film is a polyside, which consists of two layers deposited one over the other—a silicon oxide film 12A deposited by the high-temperature, low-pressure CVD method and a BPSG film deposited by the CVD method. The lower layer or silicon oxide film 12A is formed to prevent leakage of B and P from the BPSG film 12B and deposited to the thickness of, for example, 100–200 [nm]. The upper BPSG film 12B is designed to planarize the surface of the insulating film 12 and is deposited to the thickness of about 400–500 [nm] before being reflowed.

The data line 13 may, for example, be formed of an aluminum alloy, which is deposited by sputtering to the thickness of 400–600 nm. The aluminum alloy contains at least one of Si and Cu additives, Si contributing to preventing an alloy spike phenomenon and Cu helping to increase an electro-migration resistance.

Dyer the data line 13 are formed a main word line (WL) 15 and a reference voltage line ($V_{ss}$) 15, with an interlayer insulating film 14 interposed therebetween.

The interlayer insulating film 14 may, for example, be formed of a silicon oxide film, which is deposited to the thickness of 900–1100 nm by a plasma CVD method using a tetraethoxy silane gas as a source gas.

The main word line 15 and the reference voltage line 15 are formed, for example, of an aluminum alloy deposited to the thickness of 900–1100 nm by sputtering. The SRAM of this embodiment employs a word line dividing method, in which the main word line 15 interconnects word drivers and a decoder, the word drivers driving the divided sections of the word line that is divided along the length. The reference voltage line 15 is electrically connected with the reference voltage line 6 at a position between the memory cells M for each predetermined number of memory cells M.

Over the main word line 15 and the reference voltage line 15 is formed a final protective film (final passivation film) 16.

Figure 3D:
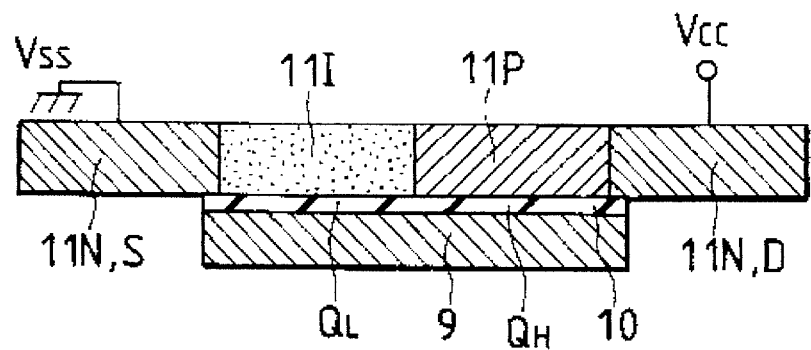

The basic structure of the negative characteristic MISFETs $Q_H$, $Q_L$ of the memory cell M is shown in FIG. 3D (modeled cross section). The current-voltage characteristic of the negative characteristic MISFETs $Q_H$, $Q_L$ are shown in FIG. 4.

As shown in the current-voltage characteristic of FIG. 4, since the negative characteristic curve of the negative characteristic MISFET $Q_H$ is set with a high threshold voltage, the minimum current region is set in a high voltage portion of the curve. On the contrary, the negative characteristic curve of the negative characteristic MISFET $Q_L$ is set with a low threshold voltage, so that the minimum current region is set in a low voltage portion of the curve. Since the negative characteristic MISFETs $Q_H$, $Q_L$ are connected in series, the negative characteristic curves of these MISFETs are coupled. That is, the ON current region of the negative characteristic curve for the negative characteristic MISFET $Q_L$ and the tunneling current region of the curve for the negative characteristic MISFET $Q_H$ are connected together. Hence, the connected portion of the negative characteristic curve constitutes the maximum current region where the inclination is zero (differential coefficient is zero).

Since the threshold voltage of the negative characteristic MISFET $Q_H$ is set high, the inclination of the combined negative characteristic curve of the negative characteristic MISFET $Q_H$ in the tunneling current region can be made large, increasing the current difference between the maximum current region in the connected portion and the minimum current regions. When the current difference between the maximum current region and the minimum current regions in the negative characteristic curve is large (when the shaded areas S1, S2 enclosed by the negative characteristic curve and the resistive element R are large), the noise margin of charges stored as information in the information storage node region of the memory cell M can be improved.

Conversely, in the combined negative characteristic curve, since the threshold voltage of the negative characteristic MISFET $Q_L$ is set high minimizing the effect of the field from the gate electrode 9, the inclination of the combined negative characteristic curve of the negative characteristic MISFET $Q_L$ in the tunneling current region can be made small.

the combined negative characteristic curve, as shown in FIG. 4, has three stable points (operation points) PL, PO and PH where the voltage and current values are held constant, at intersections between it and the inclined line of the current-voltage characteristic of the resistive element R. These three stable points PL, PO, PH correspond to a low level, an intermediate level and a high level and constitute information to be stored in the information storage node region $V_M$ of the memory cell M.

Next, by referring to FIG. 5 and FIG. 4, the operation for writing and reading information to and from the SRAM memory cell M will be briefly explained.

<Write Operation>

First, let us explain about the operation of writing high-level information. As shown in FIG. 5, a data line DL is selected (applied with a potential $V_{DH}$) and at the same time a word line WL is selected (applied with the supply voltage $V_{cc}$). This operation selects a specified memory cell M, causing a charge representing high-level information to be stored (memorized) in the information storage node region $V_M$ of the selected memory cell M. Then, the word line WL is deselected (applied with the reference voltage $V_{ss}$). The information storage node region $V_M$ has a potential equal to the data line selection potential $V_{DH}$ subtracted of the threshold voltage $V_{th}$ of the transfer MISFET $Q_T$ (i.e. $V_M = V_{DH} - V_{th}$). If the charge stored in the information storage node region $V_M$ is higher than the voltage $V_H$ shown in FIG. 4 ($V_M > V_H$), in other words, if the data line selection potential $V_{DH}$ is so set as to make $V_M$ larger than $V_H$, the stable point PH becomes the operation point. Since the leakage current is minimal, the storage current $I_M$ in the information storage node region $V_M$ is equivalent to the high-level storage current $I_H$ ($I_M = I_H \gg$ leakage current), statically holding the voltage $V_H$ representing the high-level information in the information storage node region $V_M$.

Next, let us turn to the operation of writing low-level information. As shown in FIG. 5, a data line DL is selected (applied with a potential $V_{DL}$) and at the same time a word line WL is selected. This operation selects a specified memory cell M, causing a charge representing low-level information to be stored in the information storage node region $V_M$ of the selected memory cell M. Then, the word line WL is deselected. The information storage node region $V_M$ has a potential equal to the data line selection potential $V_{DL}$ ($V_M = V_{DL}$). If the charge stored in the information storage node region $V_M$ is lower than the voltage $V_L$ ($V_M < V_L$), in other words, if the data line selection potential $V_{DL}$ is so set as to make $V_M$ smaller than $V_H$, the stable point PL becomes the operation point. Since the leakage current is minimal, the storage current $I_M$ in the information storage node region $V_M$ is equivalent to the low-level storage current $I_L$ ($I_M = I_L \gg$ leakage current), statically holding the voltage $V_L$ representing the low-level information in the information storage node region $V_M$.

<Read Operation>

First, the data line DL is released from the information write circuit, which is not shown in FIG. 5, and at the same time the information read circuit (not shown) is activated to connect the data line DL to it. Next, as shown in FIG. 5, the data line DL is selected (applied with a potential ($V_{DH}$+ $V_{DL}$)/2) and the word line WL is selected. This operation selects the memory cell M, causing the potential of the data line DL to change according to the charge stored in the information storage node region $V_M$ of the selected memory cell M.

Where a potential $V_H$ representing the high-level information is held in the information storage node region $V_M$ of the memory cell M, the potential of the data line DL changes $\Delta V_H$. The change in the data line potential is determined as "high-level information" and amplified by the sense amplifier SA, before being output from the SRAM through an output amplifier DM and an output buffer (not shown).

Where a potential $V_L$ representing the low-level information is held in the information storage node region $V_M$ of the memory cell M, the data line potential changes $\Delta V_L$. The change in the data line potential is determined as "low-level information" and amplified by the sense amplifier SA, before being output from the SRAM.

In the write and read operations, if the supply voltage $V_{cc}$ is taken to be 5 V, the actual electrical quantities will be as shown below.

The storage current $I_H$ is $10^{-11}$ A, the storage current $I_L$ is $10^{-9}$ A, the potential $V_H$ is 3 V, the potential $V_L$ is 1 V, and the resistance of the resistive element R is $10^9$ Ω.

Next, the process of manufacturing the aforementioned SRAM will be briefly explained by referring to FIG. 12 through 15 (cross sections of the memory cell in each manufacturing step).

First, a p⁻-type semiconductor substrate 1 formed of a single-crystal silicon is prepared. On the principal plane of the p⁻-type semiconductor substrate 1, a p⁻-type well region 2 and an n⁻-type well region are formed. For simplicity, the following description centers on the manufacturing method of the memory cell M.

Figure 8:
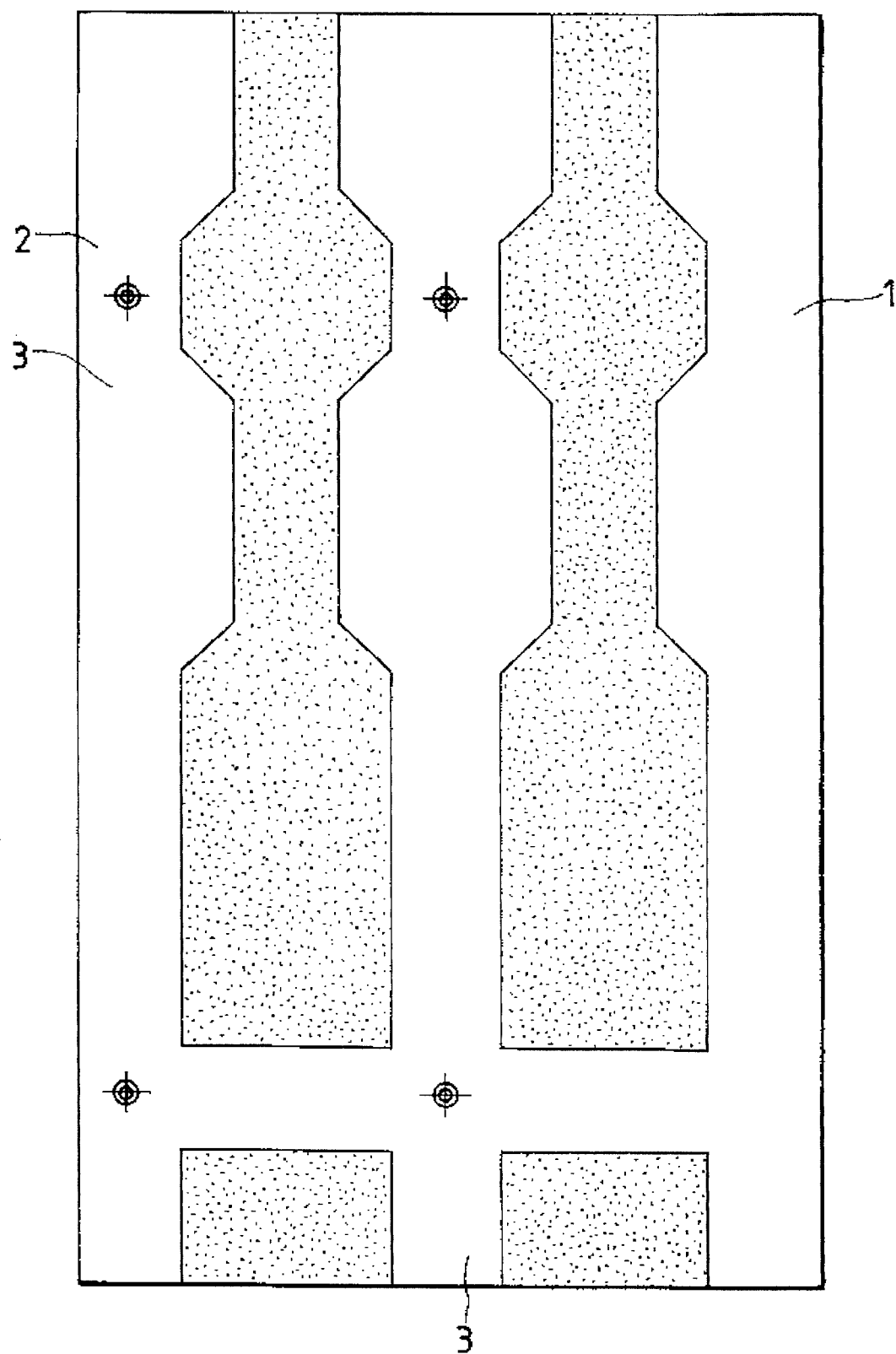
FIG. 8 is a plan view of a memory cell in the first process of manufacture.
Figure 12:
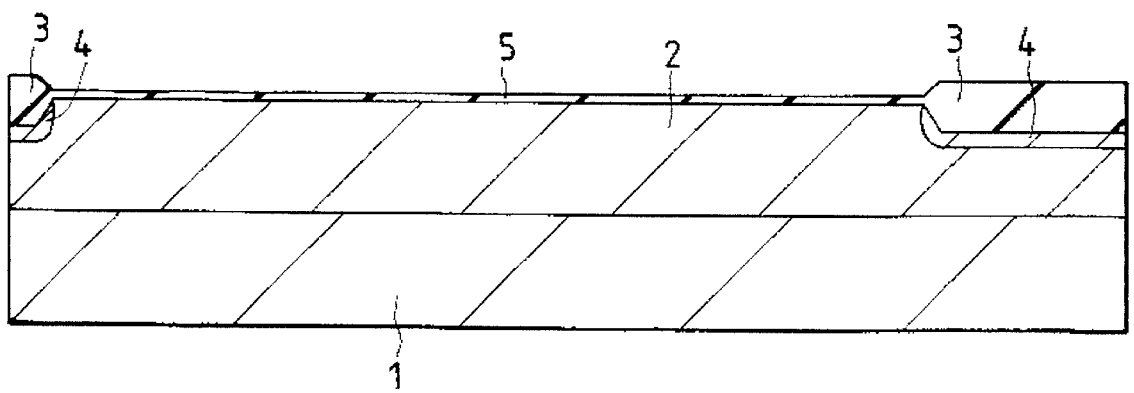
FIG. 12 is a cross section of the memory cell in the first process of manufacture.

Next, in the inert region on the principal plane of the p⁻-type well region 2, an element isolation insulating film 3 and a p-channel stopper region 4 are formed by a known selective oxidation method. Then, as shown in FIG. 12 and 8, a gate insulating film 5 is formed in the active region on the principal plane of the p⁻-type well region 2.

Next, in the active region on the principal plane of the p⁻-type well region 2, a gate electrode 6 is formed over the gate insulating film 5 and at the same time, in the inert region a word line 6 and a reference voltage line, 6 are formed over the element isolation insulating film 3.

Then, with the gate electrode 6 used as a mask, ions are implanted to form a lightly doped n-type semiconductor region 7 in the active area on the principal plane of the p⁻-type well region 2.

Next, a sidewall spacer 8 is formed covering mainly the sidewalls of the gate electrode 6. The sidewall spacer 8 is formed of a silicon oxide film and self-aligned with the gate electrode 6.

Figure 13:
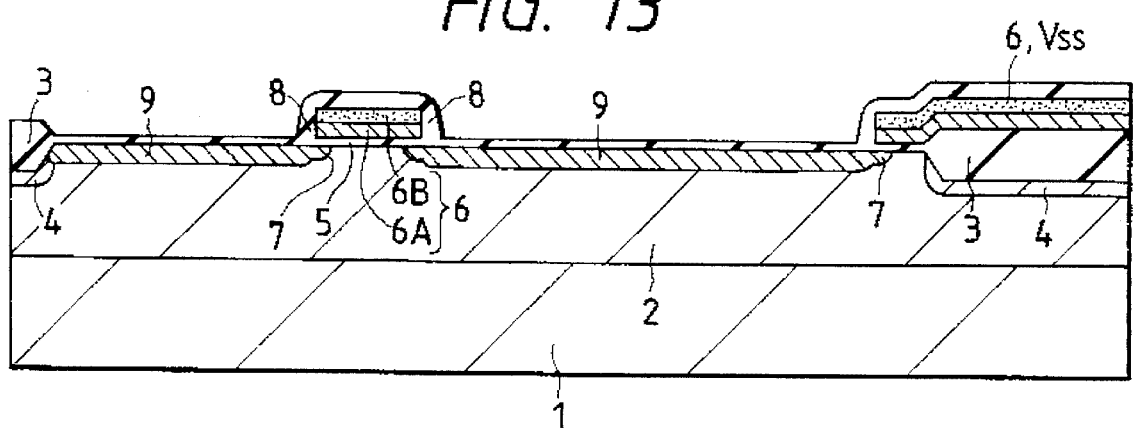
FIG. 13 is a cross section of the memory cell in the second process of manufacture.

Next, as shown in FIG. 13 and 9, with the gate electrode 6 and the sidewall spacer 8 used as a mask, ions are implanted to form a highly doped n⁺-type semiconductor region 9 in the active area on the principal plane of the p⁻-type well region 2. During the process of forming the n⁺-type semiconductor region 9, the transfer MISFET $Q_T$ with the LDD structure is almost completed in the memory cell M. At the same time, the information storage capacitive element C is mostly finished.

After this, a gate insulating film 10 is formed at least over the surface of the n⁺-type semiconductor region 9, which corresponds to the second semiconductor region of the transfer MISFET $Q_T$. Then, a connection hole 10C is formed in the gate insulating film 10 on the surface of the n⁺-type semiconductor region 9, which corresponds to the second semiconductor region of the transfer MISFET $Q_T$. At the same time, a connection hole 10H is formed in the insulating film 10 over the reference voltage line 6 and the word line 6 (not shown).

Next, a polycrystalline silicon film (non-doped polysilicon film) 11 is formed over the entire surface of the substrate including the gate insulating film 10 and the insulating film 10, and is patterned to a desired shape. The patterned polycrystalline silicon film 11 is connected to the n⁺-type semiconductor region 9 through the connection hole 10C formed in the gate insulating film 10 and also to the reference voltage line 6 through the connection hole 10H formed in the insulating film 10.

Figure 14:
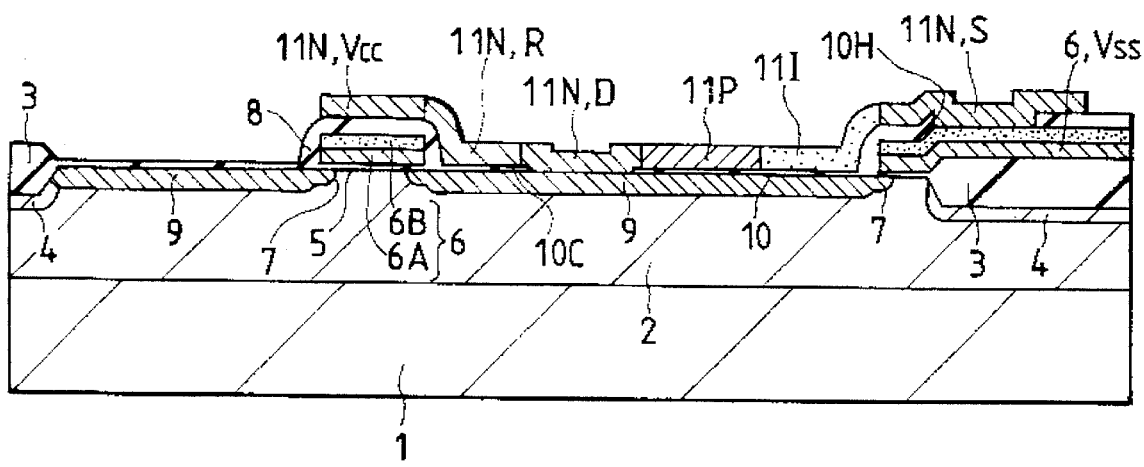
FIG. 14 is a cross section of the memory cell in the third process of manufacture.

Then, as shown in FIG. 14 and 10, a low concentration of n-type impurity, a high concentration of n-type impurity and a p-type impurity are introduced into the polycrystalline silicon film 11. The low concentration of n-type impurity is introduced into the resistive element R forming region to form the resistive element R there. The high concentration of n-type impurity is introduced into the drain region forming area of the negative characteristic MISFET $Q_H$, the source region forming area of the negative characteristic MISFET $Q_L$, and the supply voltage line forming area to form a drain region (D) 11N, a source region (S) 11N, and a supply voltage line ($V_{cc}$) 11N. The p-type impurity is introduced into the area of the channel forming region for the negative characteristic MISFET $Q_H$ to form the channel forming region 11P. These impurities are doped through the masks formed by photolithography.

With the impurities introduced, the resistive element R and negative characteristic MISFETs $Q_H$, $Q_L$ are almost completed.

Figure 15:
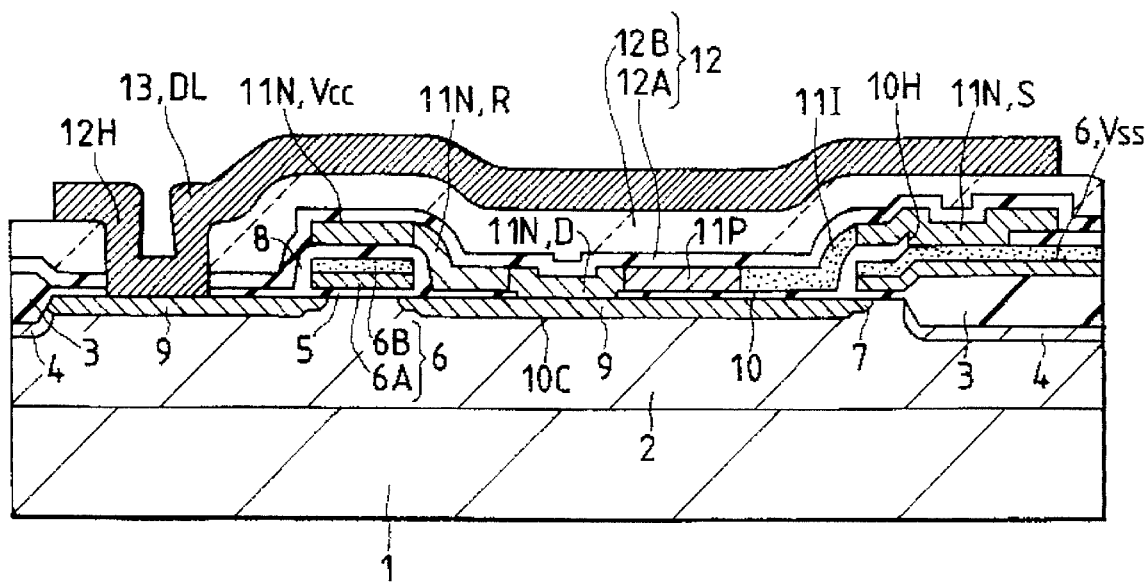
FIG. 15 is a cross section of the memory cell in the fourth process of manufacture.

This is followed by formation of the interlayer insulating film 12. Then, on the n⁺-type semiconductor region 9, which corresponds to the first semiconductor region of the transfer MISFET $Q_T$, a connection hole 12H is formed in the interlayer insulating film 12. Then, as shown in FIG. 15 and 11, a data line (DL) 13 is formed over the interlayer insulating film 12.

Next, an interlayer insulating film 14 is formed, over which a main word line (WL) 15 and a reference voltage line 15 are deposited.

Then, a final protective film 16 is formed over the entire surface, as shown in FIG. 6 and 7.

With the above-mentioned series of steps taken, the SRAM of this embodiment is completed.

If elements that constitute peripheral circuits other than the memory array are constructed as MISFETs with TFT structure, they cannot secure an enough operating current, i.e. the drive capability is small. Hence, they are formed on the substrate like the transfer MISFET $Q_T$.

As described above, the embodiment 1 of the present invention provides the following constructions and advantages.

(1) In an SRAM (of SOI structure) having MISFETs with TFT (thin-film transistor) structure, each of which includes: a polycrystalline silicon film (thin film) 11 formed over the principal plane of a p⁻-type semiconductor substrate; a source region, a channel forming region and a drain region arranged successively along the channel length in the polycrystalline silicon film; and a gate electrode formed below the channel forming region of the polycrystalline silicon film 11 with a gate insulating film interposed therebetween;

the SRAM memory comprises:
a negative characteristic MISFET $Q_H$ having the TFT structure and a first threshold voltage; and
a negative characteristic MISFET $Q_L$ formed of the same channel conductivity type as the negative characteristic MISFET $Q_H$, the negative characteristic MISFET $Q_L$ having a thin film structure and a second threshold voltage different from the first threshold voltage of the negative characteristic MISFET $Q_H$, the gate electrode of the negative characteristic MISFET $Q_L$ being electrically shorted to the gate electrode of the negative characteristic MISFET $Q_H$, the drain region of the negative characteristic MISFET $Q_L$ (in this embodiment the channel forming region 11P because the drain region is omitted) being electrically connected in series with the source region of the negative characteristic MISFET $Q_H$ (in this embodiment the channel forming region 11P because the source region is eliminated).

The above construction (1) produces the following functions and advantages in the SRAM memory.

(A) Both the negative characteristic MISFETs $Q_H$, $Q_L$ with the TFT structure exhibit a negative characteristic in which when the transistors are not conducting, the interband tunneling current caused by an electric field at the drain end is dominant and as the gate voltage increases, the electric field at the drain end is alleviated, reducing the current. When the gate voltage is further increased, the ON current flows increasing the current. That is, in the current-voltage characteristic, a minimum current region exists for a specified gate voltage. By changing the second threshold voltage of the negative characteristic MISFET $Q_L$ with respect to the first threshold voltage of the negative characteristic MISFET $Q_H$ and by electrically connecting the negative characteristic MISFETs $Q_H$, $Q_L$ in series, it is possible to produce two negative characteristic curves with different voltage values for the minimum current regions. In a coupled portion of the two negative characteristic curves of the negative characteristic MISFETs $Q_H$, $Q_L$, a maximum current region exists in which the current changes it trend from the increasing to the decreasing one as the voltage increases. As a result, a total of two minimum current regions and one maximum current region can be obtained in the combined negative characteristic curve.

1B) The channel forming regions 11P, 11I of the negative characteristic MISFETs $Q_H$, $Q_L$ with the TFT structure are formed by the single layer of polycrystalline silicon film 11. These channel forming regions 11P, 11I can be set with different threshold voltages—first and second threshold voltages—simply by controlling the impurity concentrations. Hence, the negative characteristic curve with two minimum current regions and one maximum current region, mentioned in (A), can be obtained with simple techniques.

(C) Both the negative characteristic MISFETs $Q_H$, $Q_L$, which together produce a negative characteristic with two minimum current regions and one maximum current region as mentioned in (A), have their channel forming regions 11P, 11I, source regions 11N and drain regions 11N formed of a polycrystalline silicon film 11. This improves alignment of these transistors in the so-called silicon devices where elements are formed on the principal plane of the single-crystal silicon substrate (p⁻-type semiconductor substrate 1).

(2) In the construction (1), the drain region (D) 11N of the negative characteristic MISFET $Q_H$ with the thin film structure is supplied with a supply voltage $V_{cc}$, the source region (S) 11N of the negative characteristic MISFET $Q_L$ is supplied with a reference voltage $V_{ss}$ lower than the supply voltage $V_{cc}$, and the first threshold voltable of the negative characteristic MISFET $Q_H$ is set higher than the second threshold voltage of the negative characteristic MISFET $Q_L$.

The above construction (2) produces the following functions and advantages in the SRAM memory in addition to those offered by the construction (1).

(A) In the negative characteristic curve of the current-voltage characteristic of the negative characteristic MISFET $Q_H$ with TFT structure, since the inclination at which the current decreases due to the tunneling current can be set large, it is possible to increase the current difference between the minimum current region of the negative characteristic MISFET $Q_H$ and the maximum current region formed at a joint portion between the two negative characteristic curves of the negative characteristic MISFETs $Q_H$, $Q_L$.

(B) In the negative characteristic curve of the current-voltage characteristic of the negative characteristic MISFET $Q_L$, since the inclination at which the current decreases due to the tunneling current can be made small by setting the second threshold voltage smaller than the first threshold voltage of the negative characteristic MISFET $Q_H$, it is possible to reduce the current change caused by voltage change.

(3) In the construction (1) or construction (2), the channel forming region 11P of the negative characteristic MISFET $Q_H$ and the channel forming region 11I of the negative characteristic MISFET $Q_L$ are directly connected electrically with each other, with the source region of the negative characteristic MISFET $Q_H$ and the drain region of the negative characteristic MISFET $Q_L$ eliminated.

The above construction (3) provides the following functions and advantages in the SRAM memory in addition to those offered by the construction (1) or (2). The areas occupied by the source region of the negative characteristic MISFET $Q_H$ with TFT structure and the drain region of the negative characteristic MISFET $Q_L$ are reduced, which in turn reduces the combined overall occupied area of the negative characteristic MISFETs $Q_H$, $Q_L$.

(4) In the construction (1), (2) or (3), the negative characteristic MISFETs $Q_H$, $Q_L$ with TFT structure are formed in an n-channel conductivity, the channel forming region 11P of the negative characteristic MISFET $Q_H$ is formed of a p-type semiconductor region, the channel forming region 11I of the negative characteristic MISFET $Q_L$ is formed of an i-type semiconductor region, and the gate insulating film 10 of the negative characteristic MISFET $Q_H$ and the gate insulating film 10 of the negative characteristic MISFET $Q_L$ are both formed to the thickness of less than 100 [nm].

(5) In the construction (1), (2), (3) or (4), the drain (D) 11N and t-he gate electrode 9 of the negative characteristic MISFET $Q_H$ are connected to the supply voltage $V_{cc}$ through a resistive element (R) 11N which has a linearity in a current-voltage characteristic, are also connected to a data line (DL) 13 through a transfer MISFET $Q_T$ whose gate electrode 6 is connected to a word line (WL) 6, and are further connected to one electrode of an information storage capacitive element C whose second electrode is connected to a reference voltage $V_{ss}$; the source region (S) 11N of the negative characteristic MISFET $Q_L$ is connected to the reference voltage $V_{ss}$ lower than the supply voltage $V_{cc}$; and the negative characteristic MISFET $Q_H$, the negative characteristic MISFET $Q_L$, the transfer MISFET $Q_T$, the resistive element R, and the information storage capacitive element C all combine to form a memory cell M of an SRAM to store information.

The above construction (5) provides the following functions and advantages in the SRAM memory in addition to those offered by the construction (1) through (3).

(A) In the current-voltage characteristic, three stable points exist at intersections that are formed by a straight line of the current-voltage characteristic of the resistive element R passing through the current increasing region (ON current region) and current decreasing region (tunneling current region) of the negative characteristic curve of the thin-film negative characteristic MISFET $Q_H$ and through the current increasing region (On current region) of the negative characteristic curve of the negative characteristic MISFET $Q_L$. These three stable points can be used as a low level, an intermediate level and a high level for the information storage node region $V_M$ in a memory cell M. This allows the use of memory cell as an SRAM memory cell.

(B) With the above SRAM memory cell, a single memory cell M requires only one each of the negative characteristic MISFET $Q_H$, negative characteristic MISFET $Q_L$, transfer MISFET $Q_T$, resistive element R and information storage capacitive element C, reducing the occupied area of the memory cell M to almost half that of the conventional memory. Therefore, the integration level of the SRAM can be enhanced.

(6) In the construction (5), the transfer MISFET $Q_T$ in the SRAM memory cell M has the source region (n⁺-type semiconductor region 9), the channel forming region (p⁻-type well region 2) and the drain region (n⁺-type semiconductor region 9) thereof formed on the principal plane of a p⁻-type semiconductor substrate 1; the negative characteristic MISFETs $Q_H$, $Q_L$ use the second semiconductor region (n⁺-type semiconductor region 9) of the transfer MISFET $Q_T$ as their gate electrodes 9, and also have the source region (S) 11N, the channel forming region. 11P, 11I and the drain region (D) 11N thereof formed in a polycrystalline silicon film 11 which is formed over the second semiconductor region of the transfer MISFET $Q_T$ with a gate insulating film interposed therebetween; and the information storage capacitive element C is a junction capacitance formed between the second semiconductor region (n⁺-type semiconductor region 9) of the transfer MISFET $Q_T$ and the p⁻-type well region 2.

The above construction (6) provides the following functions and advantages in the SRAM memory in addition to those offered by the construction (5). Since in the SRAM memory cell M the occupied area of the second semiconductor region (n⁺-type semiconductor region 9) of transfer MISFET $Q_T$ is overlapped by the occupied areas of the negative characteristic MISFET $Q_H$, the negative characteristic MISFET $Q_L$ and the information storage capacitive element C, the integration level of the SRAM can be improved.

(Embodiment 2)

The Embodiment 2 is a second embodiment of the present invention with the occupied area of the memory cell further reduced and SRAM integration level improved.

The construction of the Embodiment 2 will be described by referring to FIG. 16 (plan view of a memory cell) and FIG. 17 (cross section taken along the line B—B of FIG. 16). FIG. 18 through FIG. 23 (plan views showing manufacturing steps) will also be referred to in explaining the memory cell structure.

The SRAM memory cell M of the second embodiment has a similar construction to the basic circuit configuration of the memory cell M in the first embodiment, except that three layers of polycrystalline silicon film 11, 21, 23 are deposited successively over the principal plane of a p⁻-type semiconductor substrate 1. Information storage section's elements are formed in the polycrystalline silicon films 11, 23.

Figure 17:
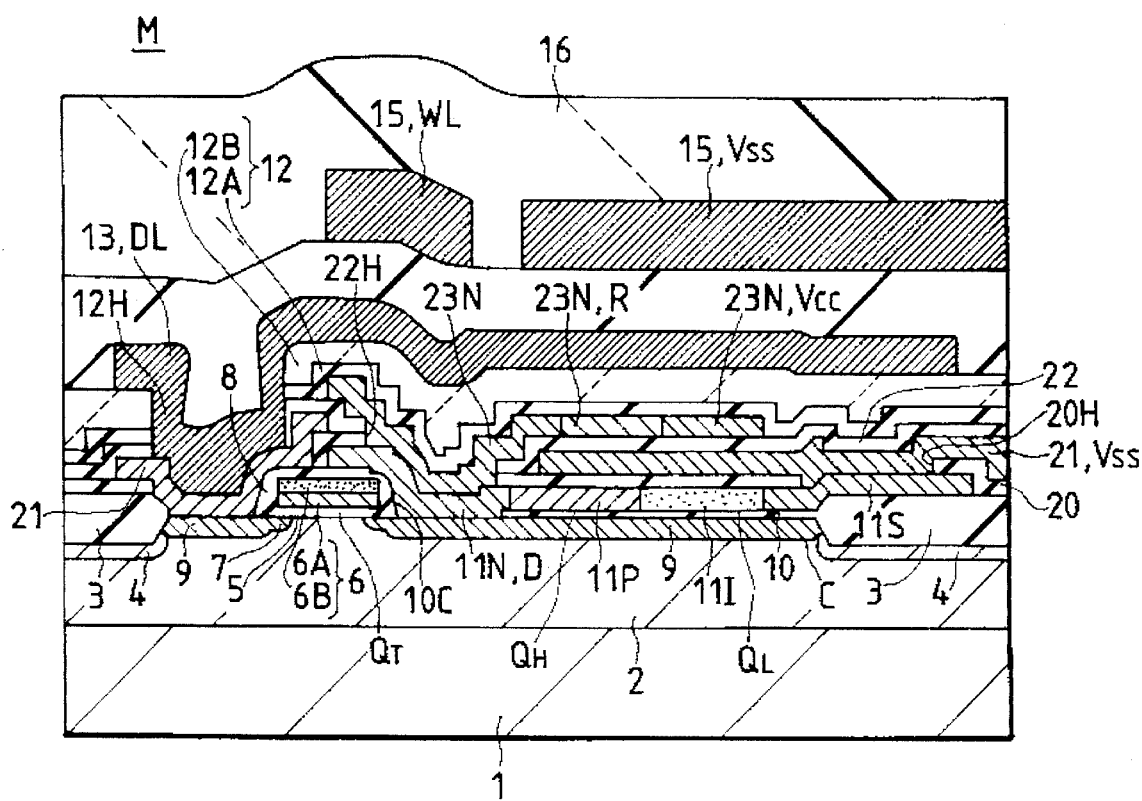
FIG. 17 is a cross section of the memory cell of FIG. 16.
Figure 16:
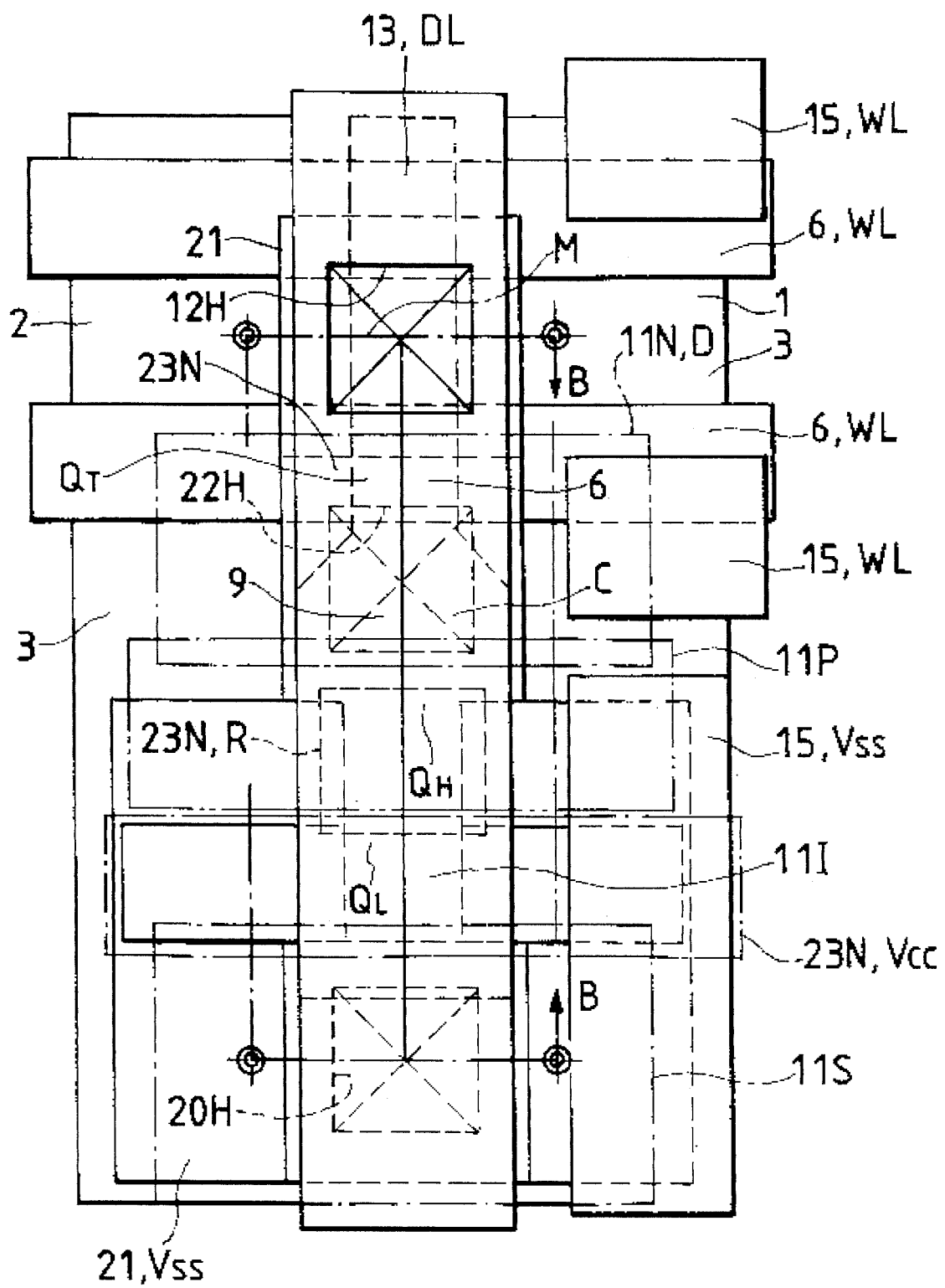
FIG. 16 is a plan view of a second embodiment of SRAM memory cell according to the present invention.

As shown in FIG. 16, 17 and 20, the negative characteristic MISFETs $Q_H$, $Q_L$ in the information storage section are formed in the same way as in the memory cell M of the first embodiment. That is, the negative characteristic MISFETs $Q_H$, $Q_L$ are formed in the first layer of the polycrystalline silicon film 11, which was deposited over the second semiconductor region (n⁺-type semiconductor region 9) of the transfer MISFET $Q_T$.

Figure 22:
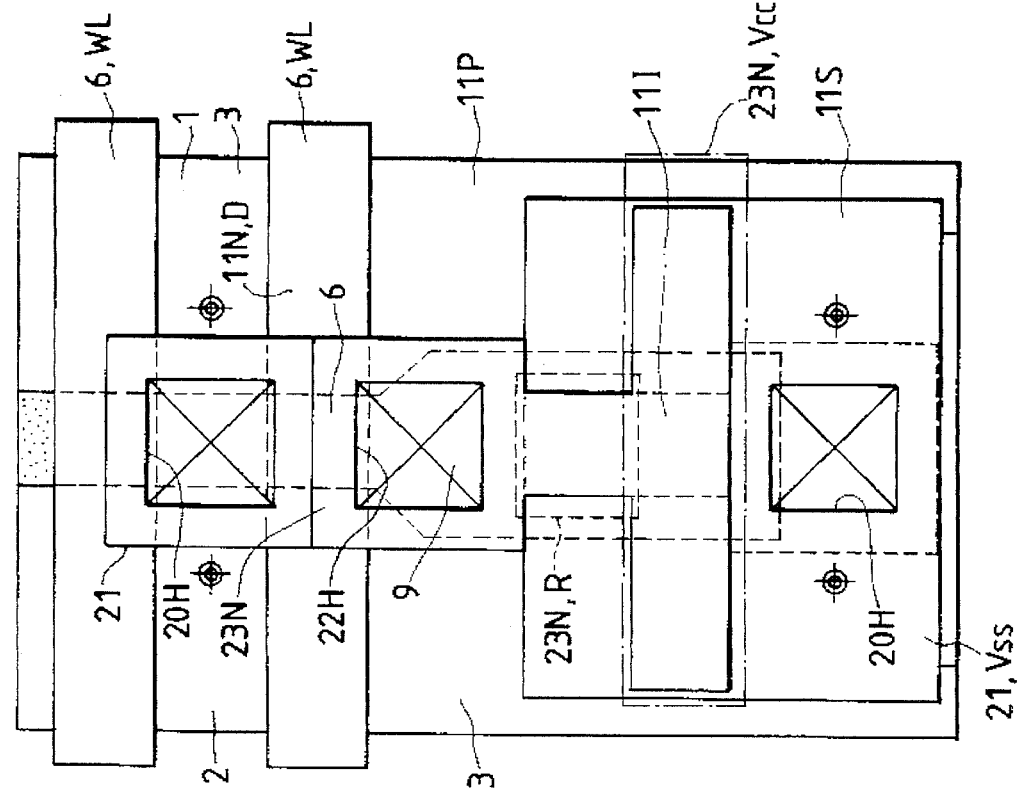
FIG. 22 is a plan view of the memory cell in the fifth process of manufacture.

The resistive element R in the information storage section, as shown in FIG. 16, 17 and 22, is formed in the third layer of the polycrystalline silicon film 23, which was formed over the second semiconductor region of the transfer MISFET $Q_T$. In other words, the resistive element R is formed by doping the polycrystalline silicon film 23 with a low concentration of n-type impurity.

One end of the resistive element R is integrally connected with an n-type region 23N. The n-type region 23N is electrically connected to the second semiconductor region (n⁺-type semiconductor region 9) of the transfer MISFET $Q_T$. The other end of the resistive element R is integrally connected with the supply voltage line ($V_{cc}$) 23N. The supply voltage line 23N is arranged on the second semiconductor region of the transfer MISFET $Q_T$.

The second layer of polycrystalline silicon film 21, as shown in FIG. 16, 17 and 21, is doped with an n-type impurity to be formed as a reference voltage line ($V_{ss}$) 21. The reference voltage line 21 is arranged at an intermediate position between the upper layer where the negative characteristic MISFETs $Q_H$, $Q_L$ are formed and the lower layer where the resistive element R and the supply voltage line 23 are formed. The reference voltage line 21 is electrically connected to the source region 11S of the negative characteristic MISFET $Q_L$ through a connection hole 20H formed in the underlying interlayer insulating film 20.

On the first semiconductor region (n⁺-type semiconductor region 9) of the transfer MISFET $Q_T$, the second layer polycrystalline silicon film 21 is formed as an intermediate conductive layer 21. The central portion of the intermediate conductive layer 21 is electrically connected to the n⁺-type semiconductor region 9 in an area enclosed by the sidewall spacer 8 of the transfer MISFEU $Q_T$ and the element isolation insulating film 3. That is, the position of connection between the central portion of the intermediate conductive layer 21 and the n⁺-type semiconductor region 9 is self-aligned with the gate electrode 6 of the transfer MISFET $Q_T$. The peripheral portion of the intermediate conductive layer 21 is formed over the gate electrode 6 of the transfer MISFET $Q_T$ and over the element isolation insulating film 3. The intermediate conductive layer 21 is electrically connected to an overlying data line 13 through a connection hole 12H. That is, the intermediate conductive layer 21 absorbs misalignment of the mask with the data line 13 during the manufacturing process, making it possible to connect the data line 13 self-aligningly to the n⁺-type semiconductor region 9.

Figure 19:
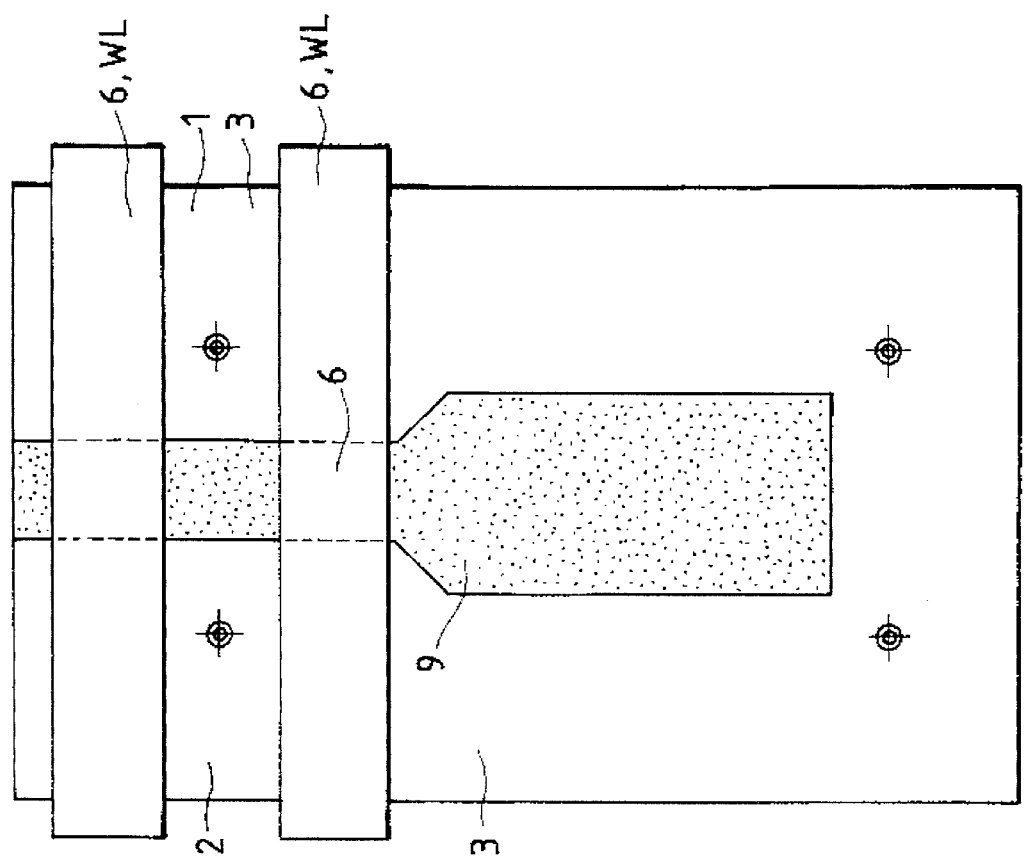
FIG. 19 is a plan view of the memory cell in the second process of manufacture.
Figure 18:
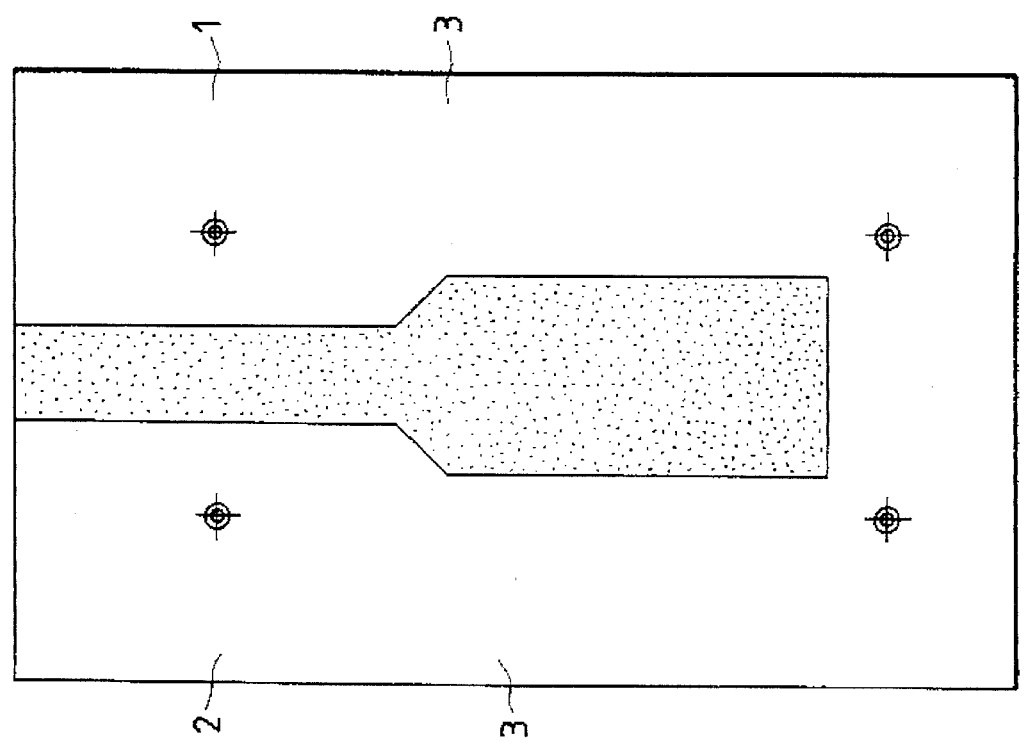
FIG. 18 is a plan view of the memory cell in the first process of manufacture.
Figure 23:
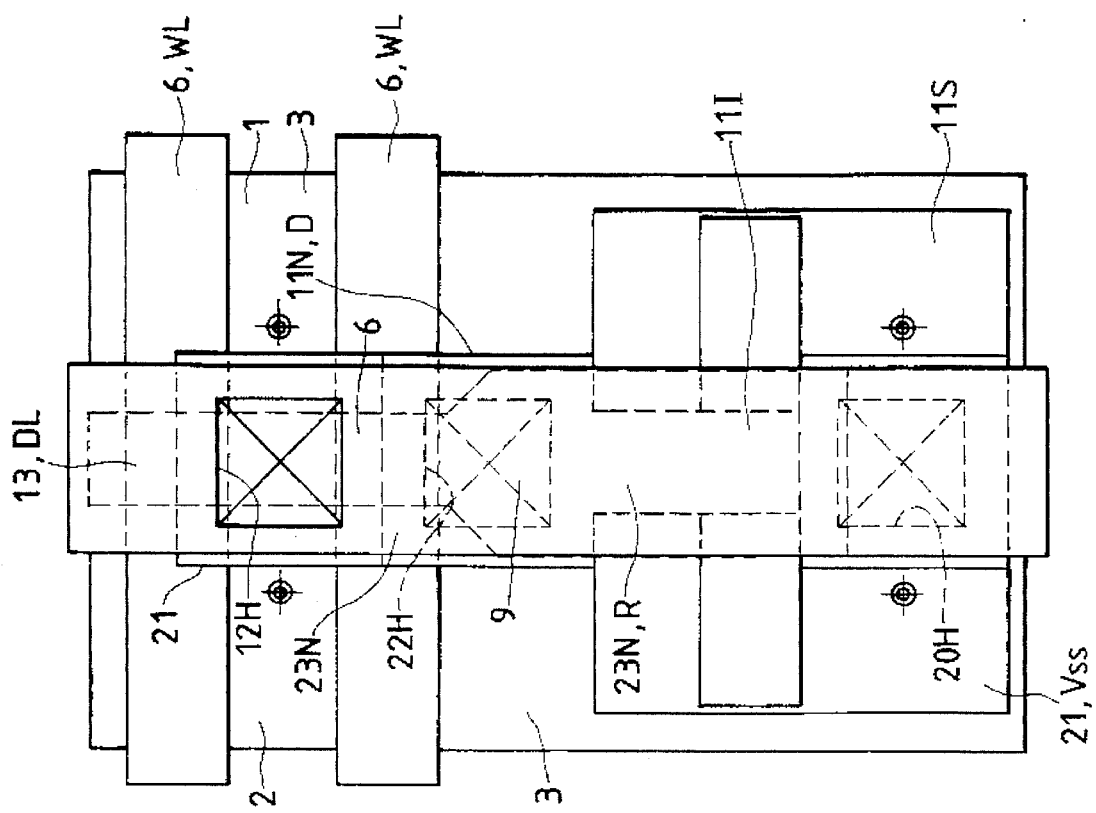
FIG. 23 is a plan view of the memory cell in the sixth process of manufacture.

FIG. 18 and 19 are plan views showing the transfer MISFET $Q_T$ in an active region or the memory cell M enclosed by the element isolation insulating film 3. FIG. 23 is a plan view showing the data line 13 and an underlying conductive layer.

As explained above, with the Embodiment 2 of the present invention, the following constructions, functions and advantages can be obtained in addition to those offered by the Embodiment 1.

(1) In the above SRAM memory cell M, the negative characteristic MISFETs $Q_H$, $Q_L$ are formed of the first layer polycrystalline silicon film 11 over the second semiconductor region of the transfer MISFET $Q_T$ (n⁺-type semiconductor region 9). The resistive element R is formed of the overlying third layer of polycrystalline silicon film 23.

With the above construction (1), since the occupied area of the second semiconductor region of the transfer MISFET $Q_T$ is overlapped by the negative characteristic MISFETs $Q_H$, $Q_L$ and the resistive element R, the overall occupied area of the memory cell M can be reduced, improving the integration level.

(2) In the above SRAM memory cell M, the reference voltage line 21 is formed of the second layer polycrystalline silicon film 21, the supply voltage line 23 is formed of the third layer polycrystalline silicon film 23, and the supply voltage line 23 is made to overlap the reference voltage line 21 with the interlayer insulating film 22 interposed therebetween.

With the above construction (2), since a smoothing capacitive element, which uses the reference voltage line 21 as one of its electrodes and the supply voltage line 23 as another, can be formed between the reference voltage line 21 and the supply voltage line 23, the voltage variation can be reduced, thus minimizing errors during the read/write operation of the memory cell M.

(3) In the above SRAM memory cell M, the supply voltage line 23 is formed over the negative characteristic MISFETs $Q_H$, $Q_L$ with the reference voltage line 21 interposed therebetween.

With the above construction (3), since the field effect from the supply voltage line 23 can be blocked or attenuated by the reference voltage line 21, the operation reliability of the negative characteristic MISFETs $Q_H$, $Q_L$ can be improved.

(Embodiment 3)

The Embodiment 3 is a third embodiment of the present invention with enhanced controllability of the negative characteristic of the negative characteristic elements in the information storage section of the SRAM memory cell.

The basic structure of the negative characteristic elements in the SRAM memory cell as the third embodiment of this invention will be described by referring to FIG. 24 (modeled cross section).

Figure 24:
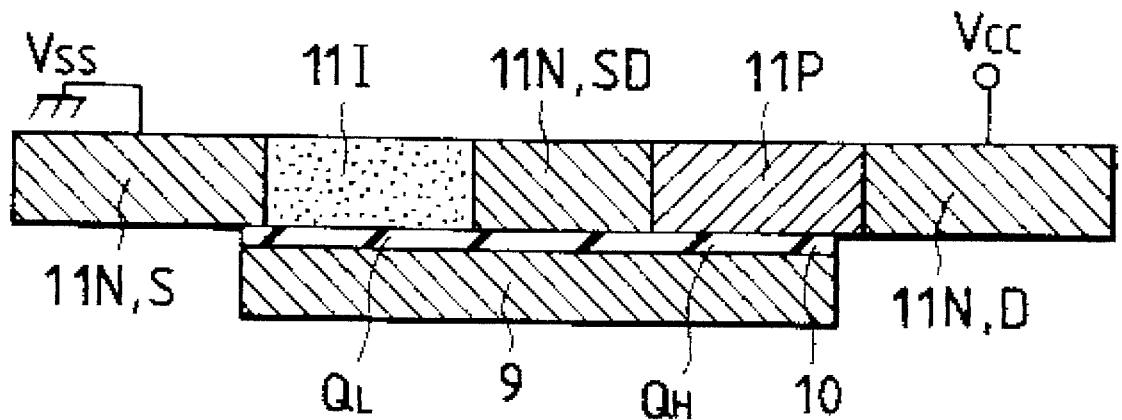
FIG. 24 is a cross section showing the basic structure of a third embodiment of SRAM memory cell according to this invention.

The negative characteristic elements in the information storage section of the SRAM memory cell M as the third embodiment, as shown in FIG. 24, are provided with a source region (S) 11N for the negative characteristic MISFET $Q_H$ and a drain region (D) 11N for the negative characteristic MISFET $Q_L$. The source region 11N of the negative characteristic MISFET $Q_H$ is formed integral with and electrically connected with the drain region 11N of the negative characteristic MISFET $Q_L$. In other words, the source region 11N of the negative characteristic MISFET $Q_H$ serves also as the drain region 11N of the negative characteristic MISFET $Q_L$.

The negative characteristic MISFET $Q_H$ has a junction reliably formed between the source region 11N and the channel forming region 11P. Likewise, the negative characteristic MISFET $Q_L$ has a junction reliably formed between the drain region 11N and the channel forming region 11I. Therefore, the impurity concentrations can be reliably controlled for the source region 11N and the channel forming region 11P of the negative characteristic MISFET $Q_H$ and for the drain region 11N and the channel forming region 11P of the negative characteristic MISFET $Q_L$.

The Embodiment 3 of the present invention provides the following constructions, functions and advantages in addition to those offered by the construction (1) or (2) of the Embodiment 1.

(1) In the construction (1) or (2) of the Embodiment 1, the source region (S) 11N of the negative characteristic MISFET $Q_H$ and the drain region (D) 11N of the negative characteristic MISFET $Q_L$ are integrally formed and commonly shared by these two MISFETs.

The above construction (1) offers the following advantages in the SRAM.

(A) The occupied area of the source region 11N of the TFT-structured negative characteristic MISFET $Q_H$ is overlapped by the occupied area of the drain region 11N of the TFT-structured negative characteristic MISFET $Q_L$, so that the total occupied area of the negative characteristic MISFETs $Q_H$, $Q_L$ can be reduced by an amount equal to one of the regions, thus improving level of integration (B) A junction is formed between the channel forming region 11P and the source region 11N of the TFT-structured negative characteristic MISFET $Q_H$ and also between the channel forming region 11I and the drain region 11N of the TFT-structured negative characteristic MISFET $Q_L$. The junctions allow reliable control of the impurity concentrations for each region, which in turn permits reliable control of the negative characteristic.

(Embodiment 4)

The Embodiment 4 is a fourth embodiment of the present invention in which the construction of the negative characteristic elements in the information storage section of the SRAM memory cell is altered.

Figure 25:
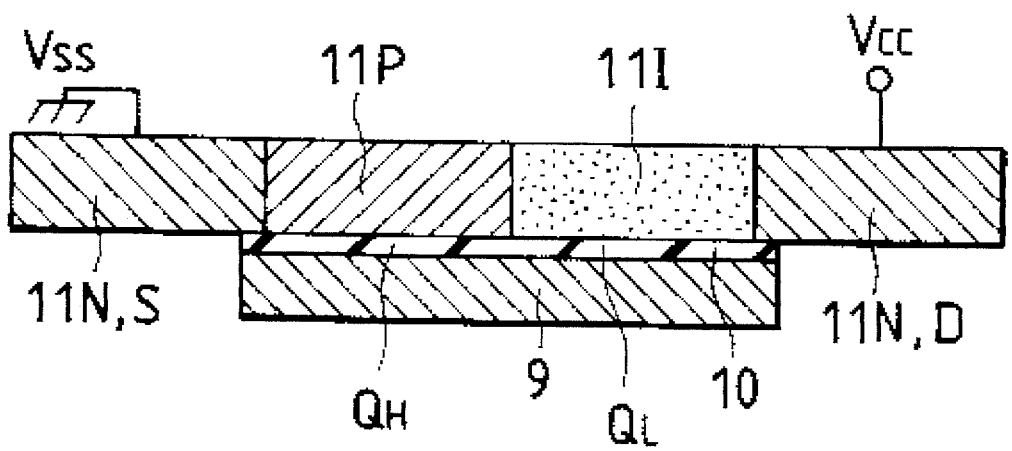
FIG. 25 is a cross section showing the basic structure of a fourth embodiment of SRAM memory cell according to this invention.

The basic structure of the negative characteristic elements in the SRAM memory cell as the fourth embodiment of this invention will be described by referring to FIG. 25 (modeled cross section).

In the information storage section of the SRAM memory cell M as the fourth embodiment, the negative characteristic MISFET $Q_L$ with low threshold voltage has its drain region (D) 11N connected with the supply voltage $V_{cc}$ while the negative characteristic MISFET $Q_H$ with high threshold voltage has its source region (S) 11N connected with the reference voltage $V_{ss}$. The channel forming region 11P of the negative characteristic MISFET $Q_H$ and the channel forming region 11I of the negative characteristic MISFET $Q_L$ are integrally formed, as with the first embodiment.

The SRAM memory cell M thus constructed has similar functions and advantages to those of the first embodiment.

The present invention has been described in detail in conjunction with some example embodiments. It is noted, however, that this invention is not limited to these embodiments but various modifications may be made without departing the spirit of the invention.

For example, in the information storage section of the SRAM memory cell M the channel forming region 11I of the negative characteristic MISFET $Q_L$ may be formed of a p-type semiconductor region.

That is, the only requirement this invention must meet is that the threshold voltage of the negative characteristic MISFET $Q_L$ is different from that of the negative characteristic MISFET $Q_H$.

The information storage section of the SRAM memory cell M may have a structure in which the gate electrode is formed over the surface of the channel forming region 11P of the negative characteristic MISFET $Q_H$ with a gate insulating film interposed therebetween. Similarly, the gate electrode may be formed over the surface of the channel forming region 11I of the negative characteristic MISFET $Q_L$ with a gate insulating film interposed therebetween.

In the information storage section of the SRAM memory cell M, the channel forming region 11P of the negative characteristic MISFET $Q_H$ and the channel forming region 11I of the negative characteristic MISFET $Q_L$ may be formed of an amorphous silicon film deposited on the substrate.

Further, in the SRAM memory cell M, the gate electrode 6 of the transfer MISFET $Q_T$ and the word line 6 may be formed of a polyside such as MoSi film and TiSi film other than WSi film.

Furthermore, in the SRAM memory cell M, the negative characteristic MISFETs $Q_H$, $Q_L$ in the information storage section may be formed in a p-type channel conductivity. In this case, the source region of the negative characteristic MISFET $Q_H$ is connected to the supply voltage $V_{cc}$ and take drain region of the negative characteristic MISFET $Q_L$ to the reference voltage $V_{ss}$.

This invention is not limited to single SRAMs but may also be applied to SRAMs incorporated in microcomputers.

The invention is not limited to SRAMs but is widely applicable to devices that require negative characteristics.

Representative advantages offered by this invention may be briefly summarized below.

(1) The invention provides novel negative characteristic elements which have good mass-productivity and offer high level of matching with silicon devices.

(2) In addition to the above advantage (1), this invention also permits optimization of the negative characteristic curve of the negative characteristic elements.

(3) In addition to the above advantage (1) or (2), it is possible to reduce the occupied area of the negative characteristic elements, enhancing the level of integration of the semiconductor integrated circuit device.

(4) In addition to the advantage (2) or (3), it is possible to perform reliable control of the negative characteristic of the negative characteristic elements.

(5) In addition to the advantage (1), (2), (3) or (4), it is possible to form SRAM memory cells using the negative characteristic elements.

(6) In addition to the advantage (5), the invention offers still another advantage of being able to improve the level of integration of the SRAM.

We claim:

1. A static random access memory device comprising a semiconductor substrate; data lines formed over the semiconductor substrate; word lines formed over the semiconductor substrate; semiconductor strips formed of silicon film over the semiconductor substrate; and memory cells each including a resistive element, a transfer MISFET and a negative characteristic MISFET, said resistive element being electrically connected to said negative characteristic MISFET in series, said transfer MISFET having a first gate insulating film, a first gate electrode coupled to one of said word lines, and source and drain regions, and said negative characteristic MISFET having a second gate electrode, wherein:

a channel forming region and source and drain regions of said negative characteristic MISFET are formed in a respective semiconductor strip, said channel forming region of said negative characteristic MISFET being formed between said source region and said drain region thereof and formed over said second gate electrode, a second gate insulating film of said negative characteristic MISFET is formed between said second gate electrode and said channel forming region thereof, said channel forming region of said negative characteristic MISFET includes a first region and a second region, said first region having an impurity concentration higher than that of said second region to make a threshold voltage contributed by said first region higher than a threshold voltage contributed by said second region, one of said source and drain regions of said transfer MISFET is electrically connected to one of said data lines, the other of said source and drain regions of said transfer MISFET is electrically connected to said drain region and said second gate electrode of said negative characteristic MISFET, and a first voltage is applied through said resistive element to said drain region of said negative characteristic MISFET and a second voltage which is lower than said first voltage is applied to said source region of said negative characteristic MISFET such that a source-drain path of said negative characteristic MISFET is electrically connected between a terminal at which said second voltage is applied and said drain region of said negative characteristic MISFET, said negative characteristic MISFET having a current-voltage characteristic including a negative resistance curve.

2. A static random access memory device according to claim 1, wherein said first region is formed between said second region and said drain region of said negative characteristic MISFET, said source and drain regions are n-type conductivity, said first region is p-type conductivity, the film thickness of said second gate insulating film is less than 10 nm, and said drain region of said negative characteristic MISFET is connected to said resistive element and is formed integrally with said semiconductor strip.

3. A static random access memory device according to claim 2, wherein said second gate electrode is formed of a first semiconductor region in said substrate and a capacitive element is formed between said second gate electrode and said substrate.

4. A static random access memory device according to claim 3, wherein said negative characteristic MISFET exhibits a negative resistance in a current-voltage characteristic.

5. A semiconductor device comprising a semiconductor substrate having a main surface; word lines formed over said main surface; data lines formed over said main surface; semiconductor strips formed over said main surface; and memory cells of a static random access memory, each comprising a first MISFET, a second MISFET and a resistive element, wherein:

said first MISFET includes a first gate insulating film formed over said main surface, a first gate electrode formed over said first gate insulating film and coupled to one of said word lines, and source and drain regions formed in said substrate, said second MISFET includes a second gate insulating film and a second gate electrode, a channel forming region and source and drain regions of said second MISFET are formed in a respective semiconductor strip in such a manner that said channel forming region of said second MISFET is formed between said source and drain regions thereof, said source and drain regions of said second MISFET having a first conductivity type, said second gate insulating film is formed between said second gate electrode and said semiconductor strip, said second MISFET and said resistive element are electrically connected in series, said drain region of said second MISFET is electrically connected to said resistive element such that a first voltage is applied to said drain region of said second MISFET through said resistive element, a second voltage being applied to said source region of said second MISFET such that a source-drain path of said second MISFET is electrically connected between a terminal at which said second voltage is applied and said drain region of said second MISFET, said second voltage being of lower magnitude than said first voltage, both said drain region of said second MISFET and said second gate electrode of said second MISFET are electrically connected to one of the source and drain regions of said first MISFET, the other one of the source and drain regions of said first MISFET being electrically connected to one of said data lines, said channel forming region of said second MISFET is comprised of a first region and a second region, said first region being formed between said second region and said drain region of said second MISFET, said first region has a second conductivity type and has an impurity concentration higher than that of said second region in such a manner that a threshold voltage contributed by said first region is higher than a threshold voltage contributed by said second region, and said second MISFET has a current-voltage characteristic including a negative resistance curve, said negative resistance curve being shaped such that it is intersecting with an inclined line of a current-voltage characteristic of said resistive element at at least three location points.

6. A semiconductor device according to claim 5, wherein said second gate insulating film has a film thickness less than 100 nm.

7. A semiconductor device according to claim 6, wherein said first and second voltages are a power supply voltage and a reference voltage, respectively, wherein said first and second conductivity types are n-type and p-type conductivity, respectively, and wherein said semiconductor strip is formed of a silicon film.

8. A semiconductor device according to claim 5, wherein said second gate electrode is formed of a first semiconductor region formed in said substrate, wherein said first semiconductor region is integrally formed with said one of the source and drain regions of said first MISFET, and wherein said substrate has said second conductivity type.

9. A semiconductor device according to claim 5, wherein a third region, formed in said semiconductor strip, is formed integrally with said resistive element and has an impurity concentration lower than that of said drain region of said second MISFET, and wherein said drain region of said second MISFET is formed between said third region and said first region of said second MISFET.

10. A semiconductor device according to claim 5, further comprising:

a first insulating film formed over said semiconductor strips and the first gate electrodes of the first MISFETs of said memory cells so as to cover said main surface, wherein the resistive elements of said memory cells are formed over said first insulating film.

11. A semiconductor device comprising a semiconductor substrate having a main surface; word lines formed over said main surface; data lines formed over said main surface; semiconductor strips formed over said main surface; and memory cells of a static random access memory, each comprising a resistive element, a transfer MISFET, and MISFET means for storing information, wherein:

said transfer MISFET includes a first gate insulating film formed over said main surface, a first gate electrode formed over said first gate insulating film and coupled to one of said word lines, and source and drain regions formed in said substrate, said MISFET means includes a second gate insulating film and a second gate electrode, said MISFET means further includes a channel forming region provided with source and drain regions thereof in a respective semiconductor strip in such a manner that said channel forming region of said MISFET means is formed between said source and drain regions thereof, said source and drain regions of said MISFET means having a first conductivity type, said second gate insulating film is formed between said second gate electrode and said semiconductor strip, said MISFET means and said resistive element are electrically connected in series, said drain region of said MISFET means is electrically connected to said resistive element such that a first voltage is applied to said drain region of said MISFET means through said resistive element, a second voltage being applied to said source region of said MISFET means such that a source-drain path of said MISFET means is electrically connected between a terminal at which said second voltage is applied and said drain region of said MISFET means, said second voltage being of lower magnitude than said first voltage, both said drain region of said MISFET means and said second gate electrode of said MISFET means are electrically connected to one of the source and drain regions of said transfer MISFET, the other of the source and drain regions of said transfer MISFET being electrically connected to one of said data lines, said channel forming region of said MISFET means is comprised of a first region and a second region, said first region being formed between said second region and said drain region of said MISFET means, said first region has a second conductivity type and has an impurity concentration higher than that of said second region in such a manner that a threshold voltage contributed by said first region is higher than a threshold voltage contributed by said second region, and said MISFET means has a current-voltage characteristic including a negative resistance curve, said negative resistance curve being shaped such that it is intersecting with an inclined line of a current-voltage characteristic of said resistive element at at least three location points.

12. A semiconductor device according to claim 11, wherein said second gate insulating film has a film thickness less than 100 nm, wherein said first and second voltages are a power supply voltage and a reference voltage, respectively, wherein said first and second conductivity types are n-type and p-type conductivity, respectively, and wherein said semiconductor strip is formed of a silicon film.

13. A semiconductor device according to claim 11, wherein said second gate electrode is formed of a first semiconductor region formed in said substrate, wherein said first semiconductor region is integrally formed with said one of the source and drain regions of said first MISFET, and wherein said substrate has said second conductivity type.

* * * * *